United States Patent
Sato et al.

(10) Patent No.: US 10,250,225 B2
(45) Date of Patent: Apr. 2, 2019

(54) AT-CUT CRYSTAL ELEMENT, CRYSTAL RESONATOR AND CRYSTAL UNIT

(71) Applicant: NIHON DEMPA KOGYO CO., LTD., Tokyo (JP)

(72) Inventors: Yoshiharu Sato, Saitama (JP); Yoshiro Teshima, Saitama (JP); Hirokazu Iwata, Saitama (JP); Kazuhiro Hirota, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 277 days.

(21) Appl. No.: 15/391,846

(22) Filed: Dec. 28, 2016

(65) Prior Publication Data
US 2017/0187349 A1    Jun. 29, 2017

(30) Foreign Application Priority Data
Dec. 28, 2015    (JP) ................. 2015-256702

(51) Int. Cl.
*H03H 9/02*    (2006.01)
*H03H 9/19*    (2006.01)

(52) U.S. Cl.
CPC .......... *H03H 9/19* (2013.01); *H03H 9/02023* (2013.01)

(58) Field of Classification Search
CPC ......... H03H 9/19; H03H 9/02023; H03H 9/15
USPC ........................................................ 310/367
See application file for complete search history.

(56) References Cited

U.S. PATENT DOCUMENTS

| 2011/0068660 A1* | 3/2011 | Naito | H03H 3/04 310/367 |
| 2015/0229291 A1* | 8/2015 | Lim | H03H 9/19 310/321 |

FOREIGN PATENT DOCUMENTS

| JP | 2014-027505 | 2/2014 |
| JP | 2014-027506 | 2/2014 |
| JP | 2015-075927 | 4/2015 |
| JP | 2015-173454 | 10/2015 |
| JP | 2015-173455 | 10/2015 |

* cited by examiner

*Primary Examiner* — Derek J Rosenau
(74) *Attorney, Agent, or Firm* — JCIPRNET

(57) ABSTRACT

An AT-cut crystal element includes a crystal element having two side surfaces (namely, a Z'-surface) intersecting with a Z-axis of a crystallographic axis thereof. At least one of the two side surfaces is constituted of three of first to third surfaces. The first to the third surfaces meeting following conditions: the first to the third surfaces intersect with one another in this order and formed by rotating a principal surface of the crystal element by predetermined angles; and expressing the angle of the first surface as $\theta 1$, a length of the first surface as D, a thickness of a part of the crystal element having the principal surface as t, and $M=D/t$, and a conversion percentage as fn (M, ($\theta 1$)), the $\theta 1$ and the M are set such that the conversion percentage fn (M, ($\theta 1$)) becomes a predetermined value Th or less.

10 Claims, 24 Drawing Sheets

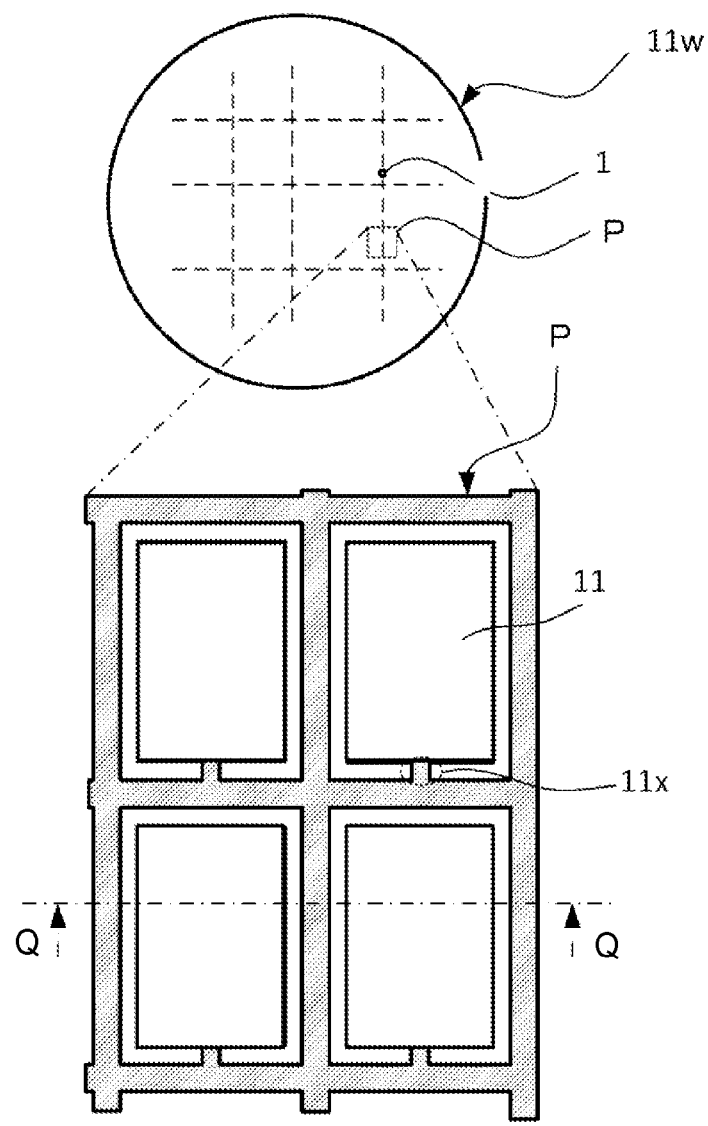
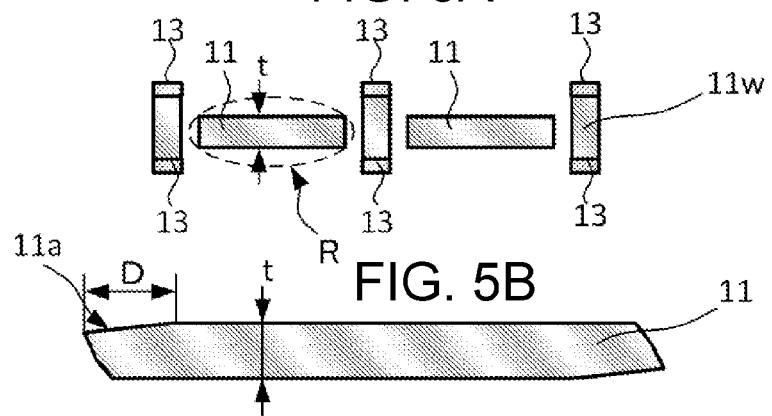
FIG. 5A
FIG. 5B
FIG. 5C

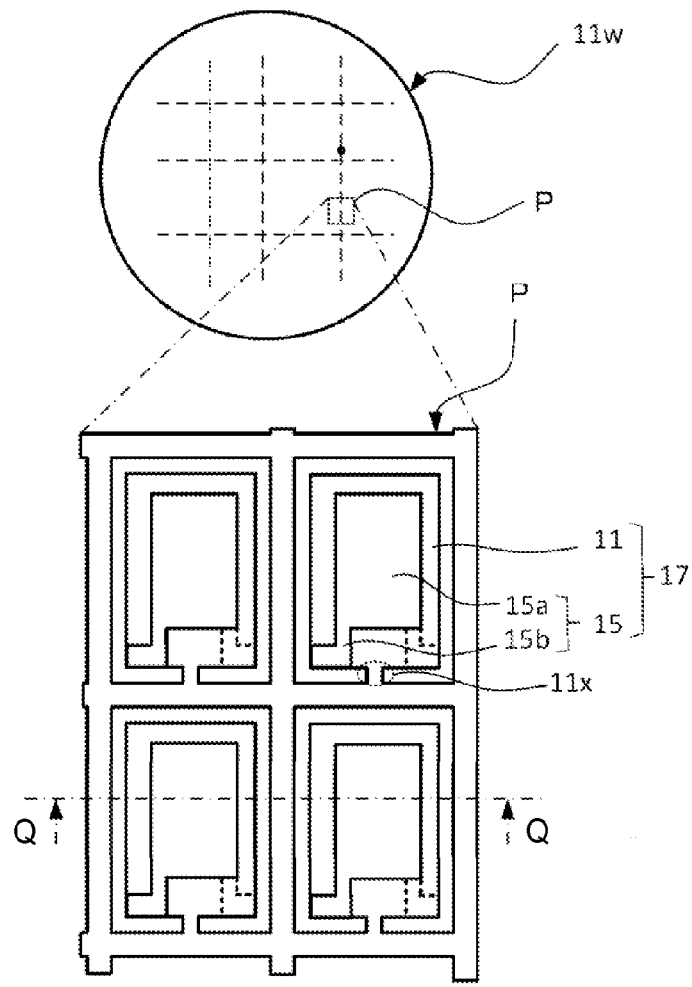
FIG. 7A
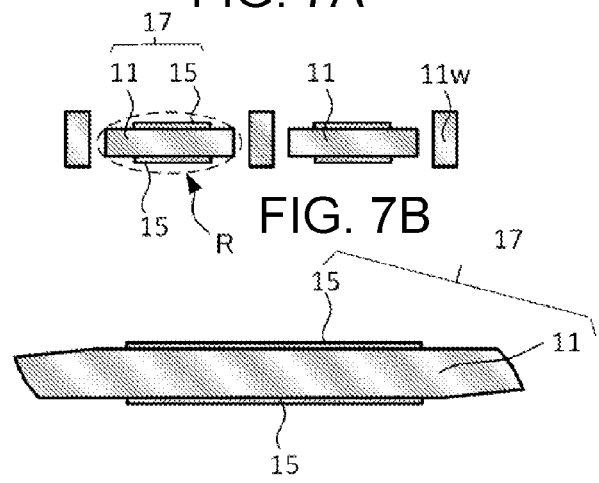
FIG. 7B
FIG. 7C

AT-CUT CRYSTAL ELEMENT, CRYSTAL RESONATOR AND CRYSTAL UNIT

CROSS-REFERENCE TO RELATED APPLICATIONS

This application is based on and claims priority under 35 U.S.C. § 119 to Japanese Patent Application No. 2015-256702, filed on Dec. 28, 2015, the entire content of which is incorporated herein by reference.

TECHNICAL FIELD

This disclosure relates to an AT-cut crystal element and a crystal unit using the AT-cut crystal element.

DESCRIPTION OF THE RELATED ART

As downsizing of an AT-cut crystal unit proceeds, it has become difficult to manufacture crystal elements for crystal units by a manufacturing method of mechanical processing. Accordingly, an AT-cut crystal element manufactured using a photolithography technique and a wet etching technique has been developed.

For example, Japanese Unexamined Patent Application Publication No 2014-27505 discloses an AT-cut crystal element manufactured by the above-described techniques that has a side surface intersecting with an X-axis of a crystal (an X-surface) constituted of at least four surfaces. Japanese Unexamined Patent Application Publication No. 2014-27506 discloses an AT-cut crystal element manufactured by the above-described techniques that has a side surface intersecting with a Z'-axis of a crystal (a Z'-surface) constituted of at least four surfaces.

The applicant of this application has proposed the following crystal element as an AT-cut crystal element manufactured using a photolithography technique and a wet etching technique and a crystal unit that includes the crystal element in Japanese Patent Application No. 2015-75927, Japanese Patent Application No. 2015-173454, and Japanese Patent Application No. 2015-173455. The crystal element has at least one side surface intersecting with a Z'-axis of a crystal constituted of three surfaces, first to third surfaces.

This AT-cut crystal element, which has at least the one side surface intersecting with the Z'-axis of a crystallographic axis of the crystal constituted of the three surfaces, the first to the third surfaces, can achieve an AT-cut crystal unit featuring less leakage of vibration and excellent properties. Accordingly, this AT-cut crystal element is desired to have a further proper shape.

A need thus exists for an AT-cut crystal element and a crystal unit which are not susceptible to the drawback mentioned above.

SUMMARY

According to an aspect of this disclosure, there is provided an AT-cut crystal element that includes a crystal element having two side surfaces, which are Z'-surfaces, intersecting with a Z'-axis of a crystallographic axis of a crystal. At least one of the two side surfaces is constituted of three surfaces, which are a first surface, a second surface and a third surface. The first surface, the second surface and the third surface meeting following conditions (a) to (e): (a) the first surface, the second surface and the third surfaces intersect with one another in this order; (b) the first surface is a surface equivalent to a surface formed by rotating an X-Z'-surface as a principal surface of the crystal element expressed by the crystallographic axis of the crystal of the crystal element by 4°±3.5° about an X-axis of the crystal as a rotation axis; (c) the second surface is a surface equivalent to a surface formed by rotating the principal surface by −57.5°±3.5° about the X-axis of the crystal as the rotation axis; (d) the third surface is a surface equivalent to a surface formed by rotating the principal surface by −42°±3.5° about the X-axis of the crystal as the rotation axis; and (e) expressing the angle which is the angle close to 4° of the first surface as θ1, a length of the first surface along a Z'-direction of the crystal as D, a thickness of a part of the crystal element having the principal surface as t, and M=D/t, and a conversion percentage from a thickness twist vibration to a surface-shear vibration of the crystal element as fn (M, (θ1)), where, n=1 or 2, the θ1 and the M are set such that the conversion percentage fn (M, (θ1)) becomes a predetermined value Th or less.

BRIEF DESCRIPTION OF THE DRAWINGS

The foregoing and additional features and characteristics of this disclosure will become more apparent from the following detailed description considered with reference to the accompanying drawings, wherein:

FIG. 5A, FIG. 5B, and FIG. 5C are explanatory drawings of the example of the manufacturing method continuous from FIG. 4B;

FIG. 7A, FIG. 7B, and FIG. 7C are explanatory drawings of the example of the manufacturing method continuous from FIG. 6;

FIG. 19 is a drawing describing the Conversion Percentage Distribution Table.

DETAILED DESCRIPTION

Figure 1A:
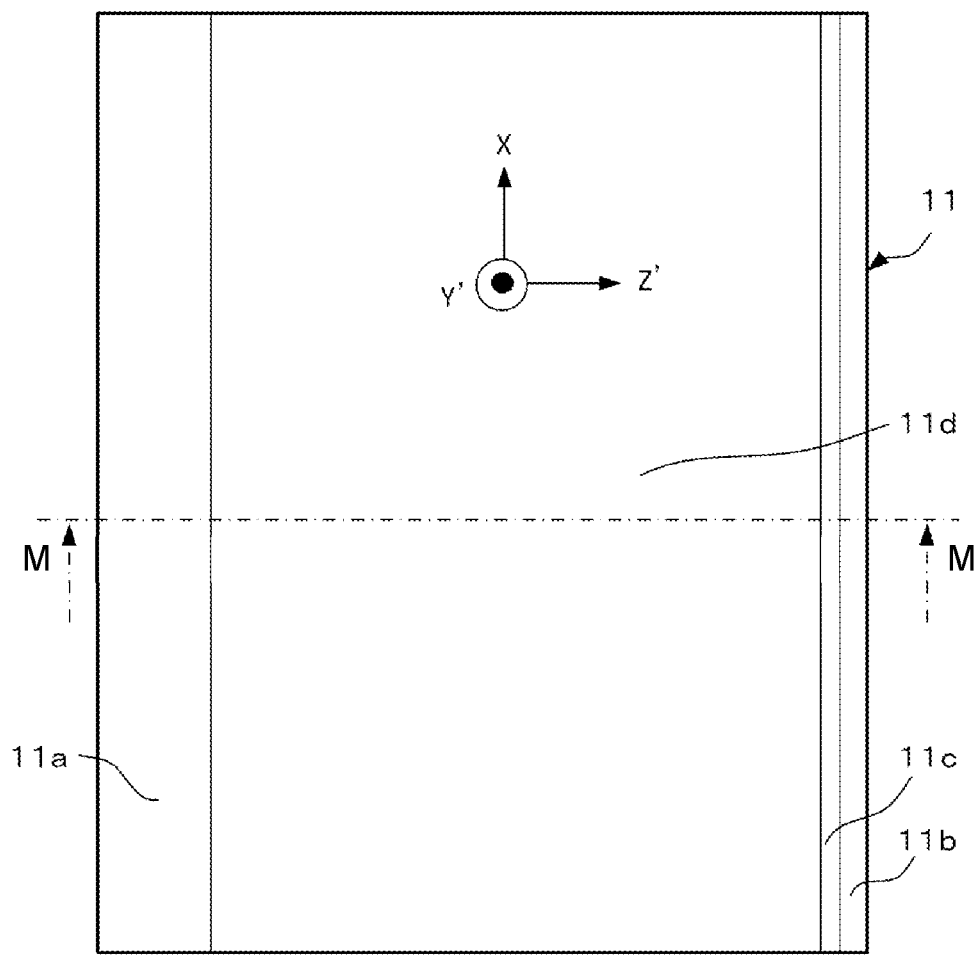
FIG. 1A, FIG. 1B, and FIG. 1C are explanatory drawings of an AT-cut crystal element 11 according to an embodiment.

The following describes embodiments of an AT-cut crystal element according to this disclosure and a crystal unit using this AT-cut crystal element with reference to the drawings. Each drawing used in the description is merely illustrated schematically for understanding this disclosure. In each drawing used in the description, like reference numerals designate corresponding or identical elements, and therefore such elements may not be further elaborated here. Shapes, dimensions, materials, and a similar factor described in the following explanations are merely preferable examples within the scope of this disclosure. Therefore, this disclosure is not limited to only the following embodiments.

1. Structure of AT-Cut Crystal Element

Figure 1B:
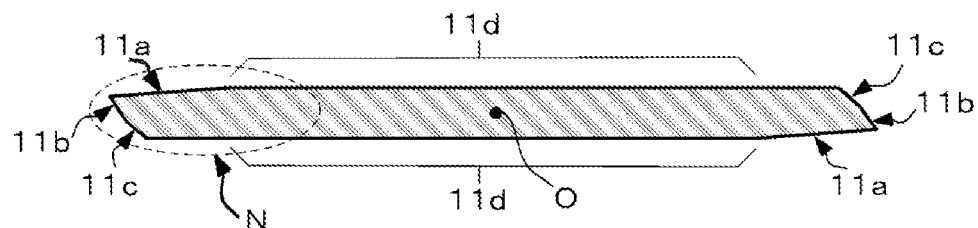
Figure 1C:
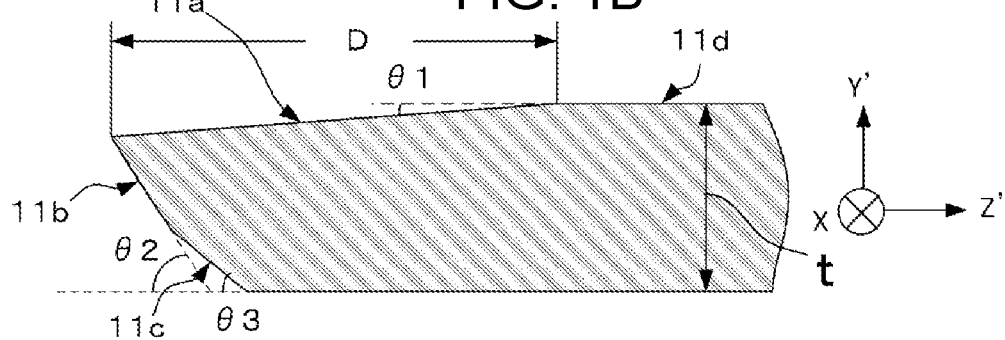

FIG. 1A to FIG. 1C are explanatory drawings of an AT-cut crystal element 11 according to the embodiment. Especially, FIG. 1A is a plan view of the crystal element 11, FIG. 1B is a cross-sectional view of the crystal element 11 taken along the line M-M in FIG. 1A, and FIG. 1C is a cross-sectional view illustrating an enlarged part N in FIG. 1B.

Each of coordinate axes X, Y', and Z' shown in FIG. 1A and FIG. 1C are crystallographic axes of a crystal in the AT-cut crystal element. The AT-cut crystal element itself is described in, for example, literature: "Handbook of Quartz Crystal Device" (Fourth Edition, page 7 or other pages, published by Quartz Crystal Industry Association of Japan, March 2002) in detail. Therefore, the explanation will be omitted.

The AT-cut crystal element 11 according to this disclosure features a shape of a side surface (a Z'-surface) intersecting with the Z'-axis of the crystal. That is, as specifically illustrated in FIG. 1B and FIG. 1C, this AT-cut crystal element 11 has respective two side surfaces (the Z'-surface) intersecting with the Z'-axis of the crystal, and each side surface is constituted of three surfaces, i.e., a first surface 11a, a second surface 11b, and a third surface 11c. Moreover, the first surface 11a is a surface meeting a principal surface 11d of this crystal element 11. Additionally, the first surface 11a is a surface equivalent to a surface formed by rotating the principal surface 11d by θ1 about the X-axis of the crystal as its rotation axis.

Furthermore, in this crystal element 11, the first surface 11a, the second surface 11b, and the third surface 11c are met in this order. Moreover, the second surface 11b is a surface equivalent to a surface formed by rotating the principal surface 11d by θ2 about the X-axis of the crystal as its rotation axis. The third surface 11c is a surface equivalent to a surface formed by rotating the principal surface 11d by θ3 about the X-axis of the crystal as its rotation axis. Although details of these angles θ1, θ2, and θ3 will be described later in the "3. Explanation of Experimental Results" section, the following has been found to be preferable. θ1=4°±3.5°, θ2=−57°±5°, θ3=−42°±5°, and more preferably θ1=4°±3°, θ2=−57°±3°, and θ3=−42°±3°.

Furthermore, expressing a length of the first surface 11a along a Z'-direction of the crystal as D, a thickness of a part of the crystal element having the principal surface 11d as t, and a ratio of D to t as M=D/t, and a conversion percentage from a thickness twist vibration to a surface-shear vibration of the crystal element 11 as fn (M, (θ1)) (where, n=1 or 2), these θ1 and M of this crystal element 11 are set such that this conversion percentage becomes a predetermined value or less. Details of the setting methods for these θ1 and M will be described later in the "4. Finite Element Method Analysis and Experimental Results" section.

In the crystal element 11 of this embodiment, respective two side surfaces (the Z'-surfaces) intersecting with the Z'-axis of the crystal are mutually disposed in a point symmetry with a center point O (see FIG. 1B) of the crystal element 11 as a center. The point symmetry mentioned here includes a point symmetry regarded as substantially identical even if the shapes slightly differ.

A planar shape of the crystal element 11 according to this embodiment is a rectangular shape that has long sides in a direction along the X-axis of the crystal and short sides in a direction along the Z-axis of the crystal.

2. Example of Method for Manufacturing AT-Cut Crystal Element 11

Next, a description will be given of the example of the method for manufacturing the AT-cut crystal element 11 according to the embodiment with reference to FIG. 2A to FIG. 8E. A large number of the crystal elements 11 can be manufactured from a quartz-crystal wafer by photolithography technique and wet etching technique. Accordingly, FIG. 2A to FIG. 8E illustrate plan views of a quartz-crystal wafer 11w and enlarged plan views of one part P of the quartz-crystal wafer 11w. Further, some drawings in FIG. 2A to FIG. 8E employ cross-sectional views taken along the line Q-Q of the one part P of the quartz-crystal wafer 11w and enlarged figures of a part R (see FIG. 5B) together.

Figure 2A:
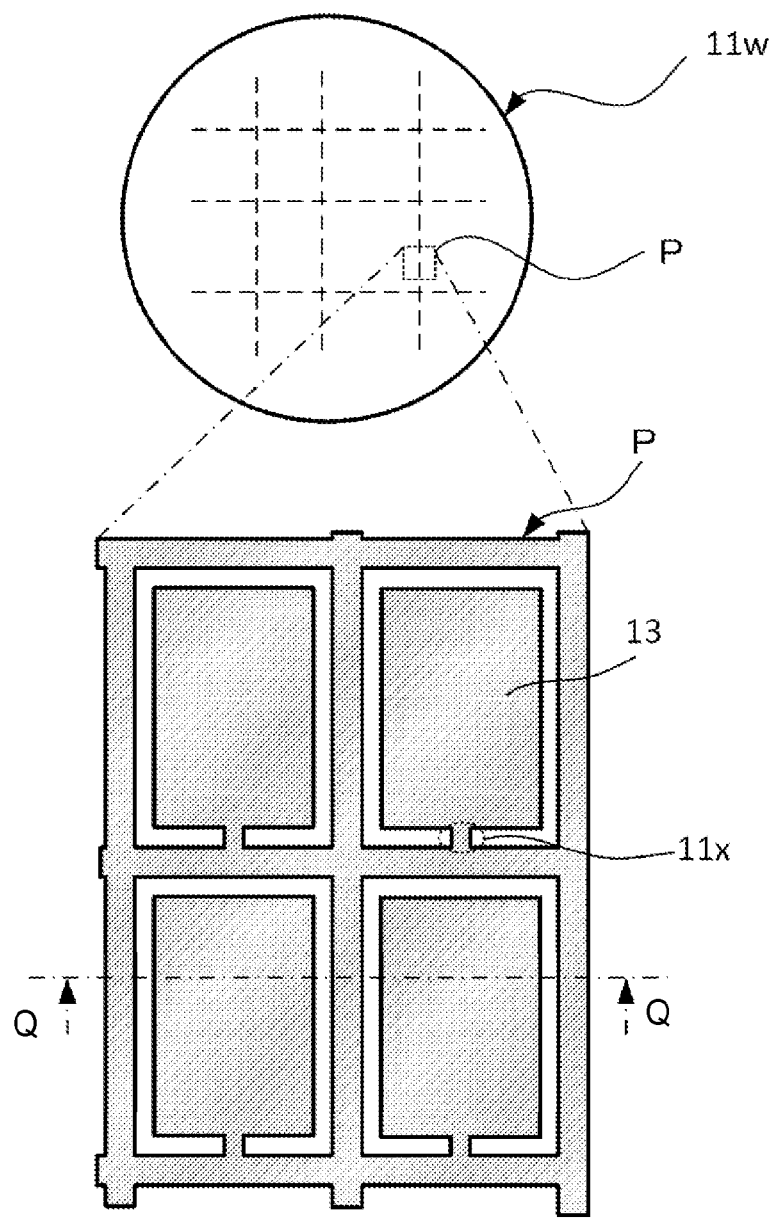
FIG. 2A and FIG. 2B are explanatory drawings of an example of a method for manufacturing the crystal element 11 according to the embodiment and a crystal unit using the crystal element 11.
Figure 2B:
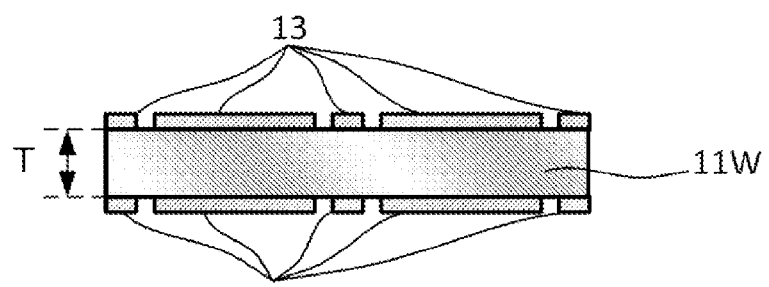
Figures 3A, 3B:
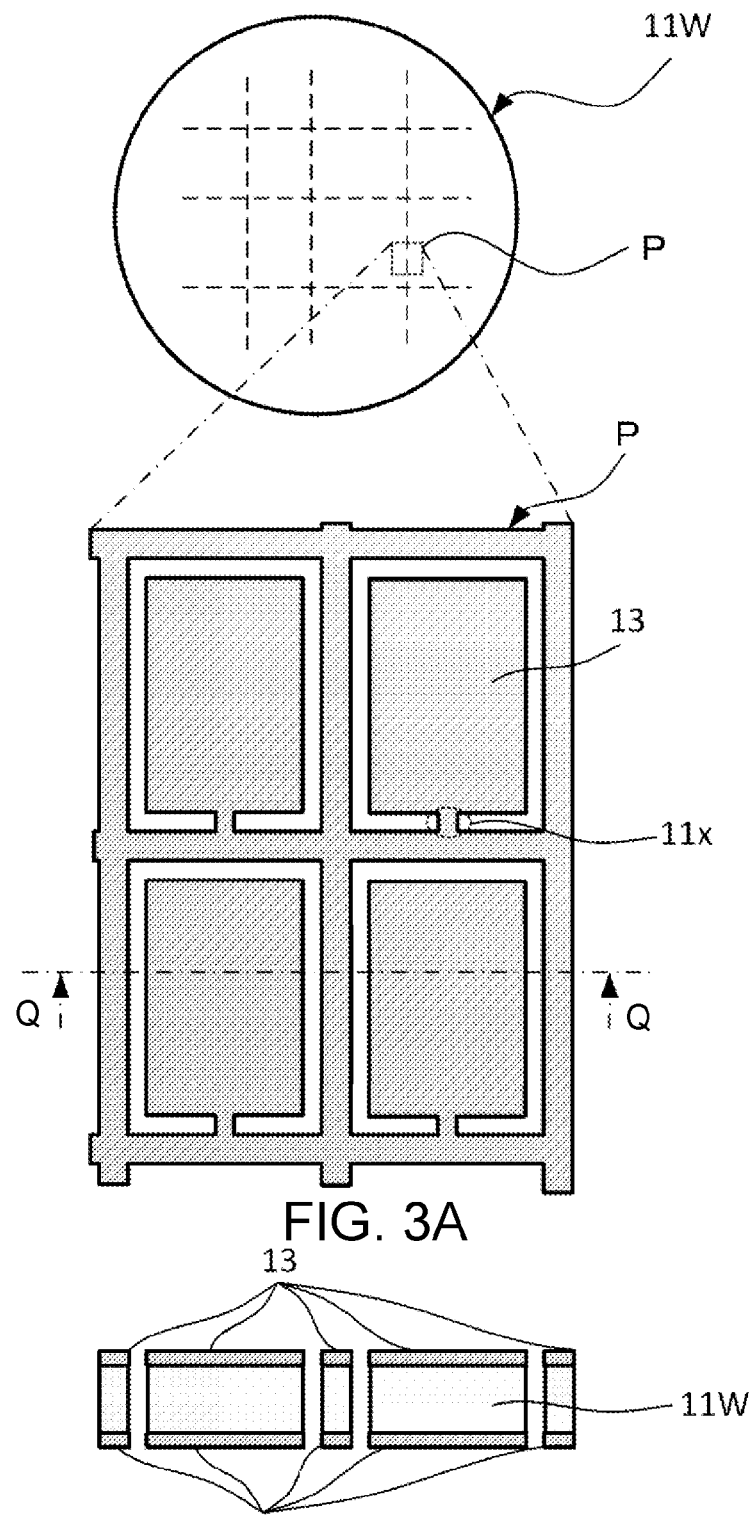
FIG. 3A and FIG. 3B are explanatory drawings of the example of the manufacturing method continuous from FIG. 2B.
Figure 4A:
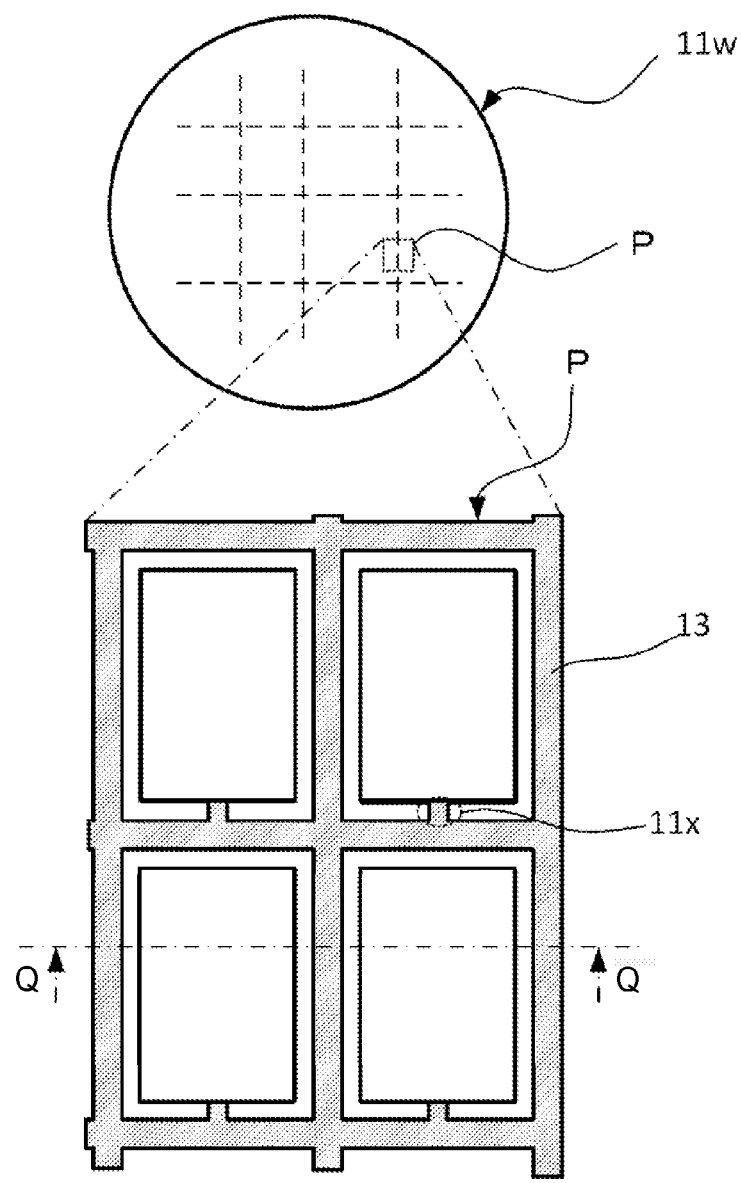
FIG. 4A and FIG. 4B are explanatory drawings of the example of the manufacturing method continuous from FIG. 3B.
Figure 4B:
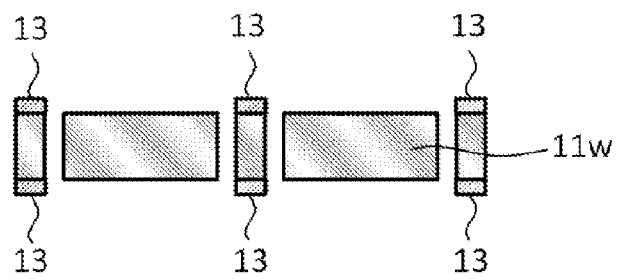

In the example of the manufacturing method, first, the quartz-crystal wafer 11w is prepared (see FIG. 2A). While, as it is well known, an oscillation frequency of the AT-cut crystal element 11 is almost determined by a thickness of a principal surface (the X-Z'-surface) of the crystal element 11, the quartz-crystal wafer 11w is a wafer with a thickness T (see FIG. 2B) thicker than a final thickness t (see FIG. 5B) of the crystal element 11.

Next, the well-known film forming technique and photolithography technique are used to form etching resist masks 13, which are masks to form an outer shape of the crystal element, on both front and back surfaces of the quartz-crystal wafer 11w. The etching resist masks 13 according to the embodiment are configured of a part corresponding to the outer shape of the crystal element, a frame part that holds each crystal element, and a part that connects the crystal element and the frame part (a part indicated by 11x in FIG. 2A). The etching resist masks 13 are formed to be opposed to one another on the front and back of the quartz-crystal wafer.

The quartz-crystal wafer 11w after the etching resist masks 13 are formed is dipped in an etching solution mainly composed of hydrofluoric acid for a predetermined period. This process dissolves parts of the quartz-crystal wafer 11w without being covered with the etching resist masks 13 to provide the rough outer shape of the crystal element 11 (see FIG. 3A and FIG. 3B).

Next, the etching resist masks 13 are removed from the quartz-crystal wafer 11w. Then, the example of the manufacturing method removes only the parts of the etching resist masks 13 corresponding to the crystal elements 11 and leaves the parts corresponding to the frame portion and the connecting portion (see FIG. 4A and FIG. 4B) to maintain strength of the frame portion and the connecting portion. Apparently, all or a part of the etching resist masks provided on the respective frame portion and connecting portion may be removed depending on the design.

Figure 9:
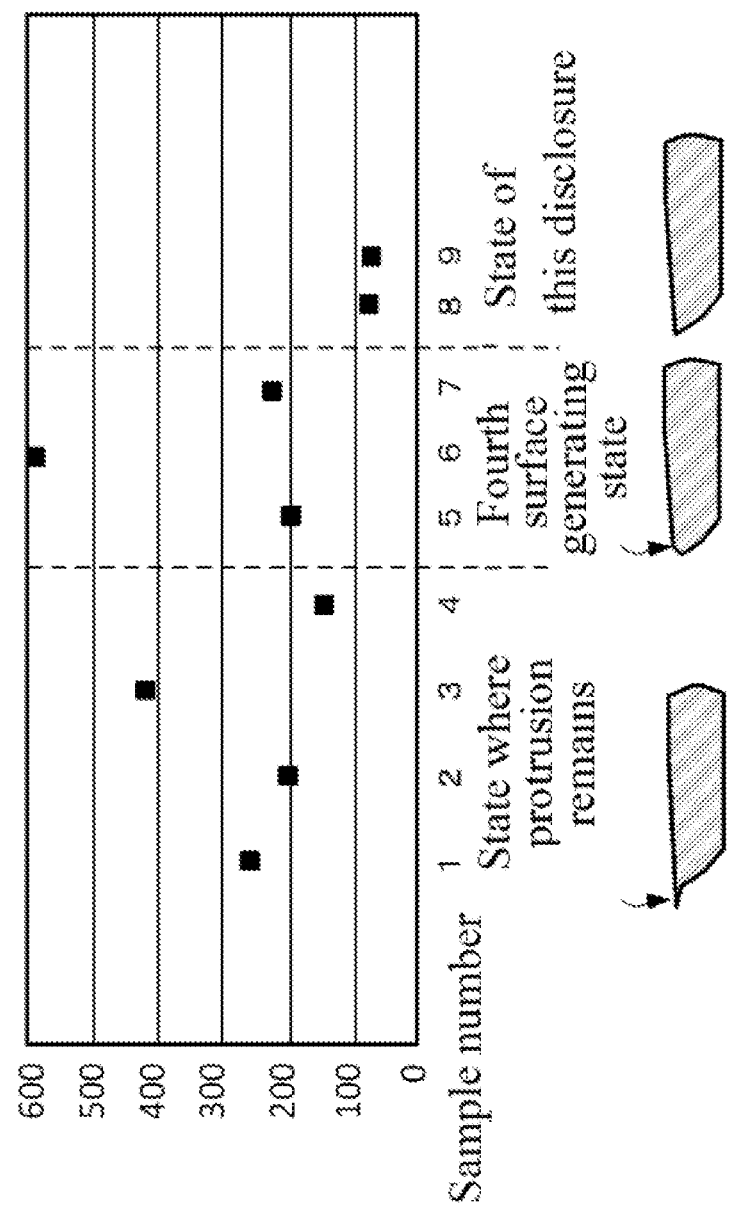
FIG. 9 is an explanatory drawing of experimental results according to this disclosure.

Next, this quartz-crystal wafer 11w is dipped again in the etchant mainly composed of hydrofluoric acid for a predetermined period. Here, the predetermined period is a period during which the thickness t (see FIG. 5B) of a forming scheduled region for the crystal element 11 can satisfy a specification of the oscillation frequency required to the crystal element 11, and the Z'-side surface of the crystal element 11 can be constituted of the first to the third surfaces 11a to 11c according to the disclosure. The period can be determined by experiments in advance. As illustrated in FIG. 9, the experiments performed by the inventor have found that, as the etching proceeds, the Z'-surface of the crystal element 11 changes its shape in the order of: a state where a protrusion remains, a state where the Z'-surface is constituted of four surfaces of first to fourth surfaces (a fourth surface generating state), and a state where the Z'-surface is constituted of three surfaces of the first to the third surfaces according to this disclosure (the state of this disclosure). Moreover, the experiments have found that, to obtain the side surfaces constituted of the three of the first to third surfaces of this disclosure, in the case where the etching is performed in the predetermined etchant, etching temperature, and a similar condition, it is necessary to perform the etching until the quartz-crystal wafer 11w has a thickness in a range of 55% to 25% with respect to the initial thickness T. Therefore, the initial thickness T, the above-described etching period, and a similar factor are determined such that the specification of the oscillation frequency and the three of the first to third surfaces are obtained. Therefore, the initial thickness T, the above-described etching period, and a similar factor are determined such that the specification of the oscillation frequency and the three surfaces of the first to the third surfaces are obtained. The angle $\theta1$ formed by the first surface 11a and the principal surface 11d falls within a range meeting $\theta1=4°\pm3.5°$ as will be described later in the experimental results. Besides, the angle $\theta1$ can be changed and controlled by a composition of the used etchant within the above-described range of the angle $\theta1$. The dimension D of the first surface 11a along the Z'-direction of the crystal can be changed and controlled by displacing the etching resist masks 13 (see FIG. 2A and FIG. 2B), which are used to form the outer shape of the crystal element, by a predetermined amount in the Z'-direction on the front and back of the wafer when the etching resist masks 13 are formed on the front and back of the quartz-crystal wafer 11w (see FIG. 2A and FIG. 2B).

Figure 6:
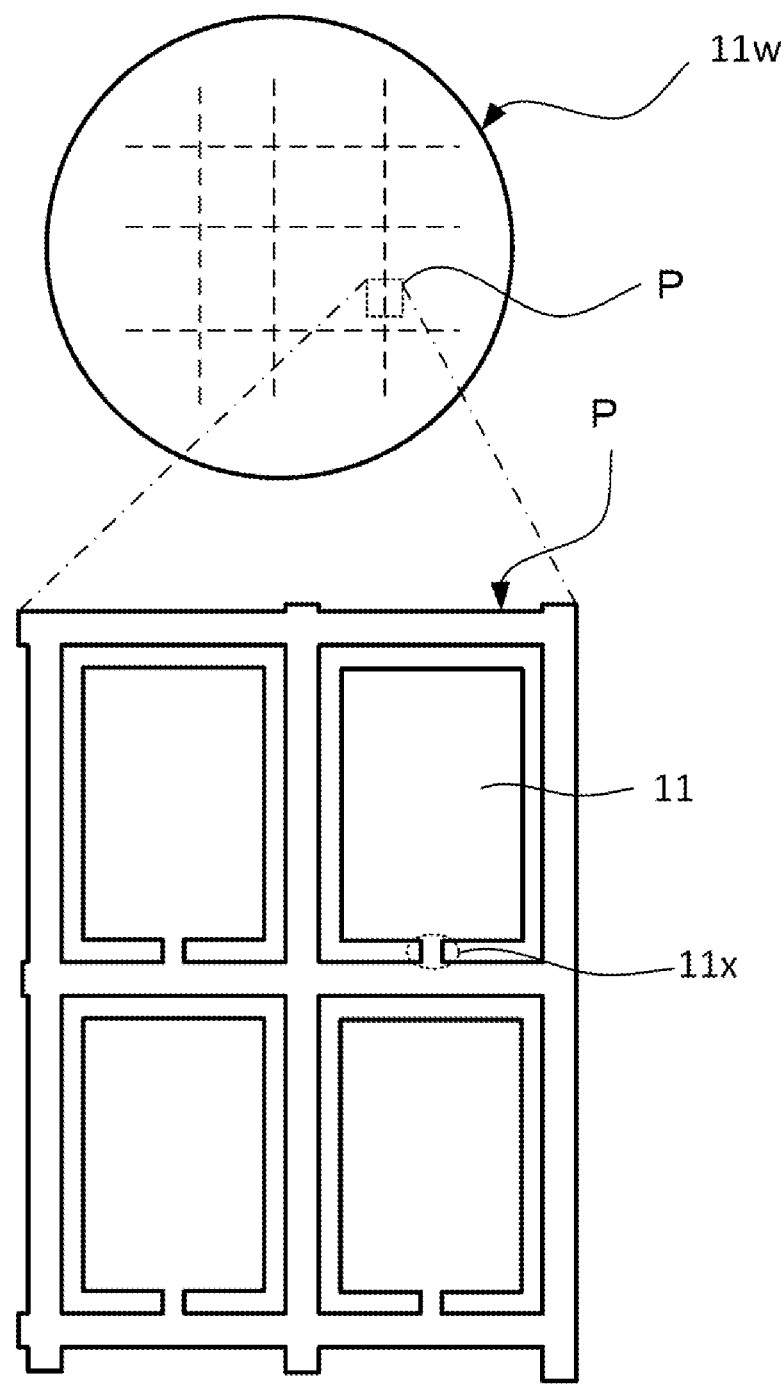
FIG. 6 is an explanatory drawing of the example of the manufacturing method continuous from FIG. 5C.
Figure 8A:
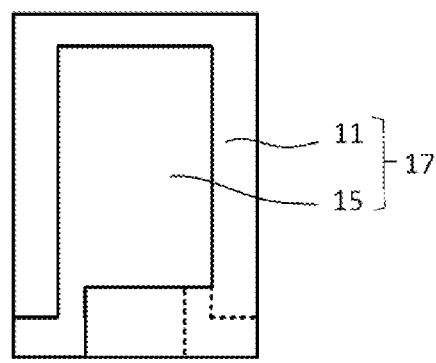
FIG. 8A, FIG. 8B, FIG. 8C, FIG. 8D, and FIG. 8E are explanatory drawings of one example of a crystal unit manufactured with the crystal element 11 mounted.
Figure 8B:
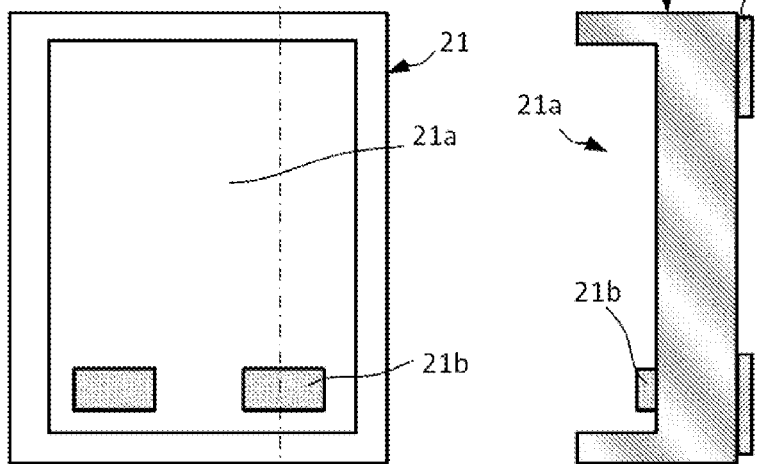
Figure 8C:
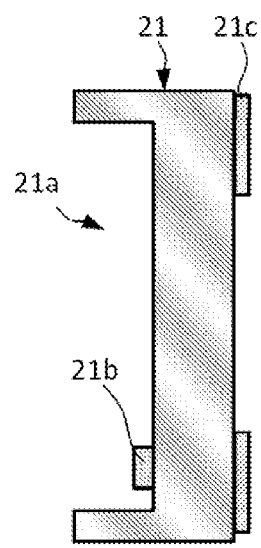
Figure 8D:
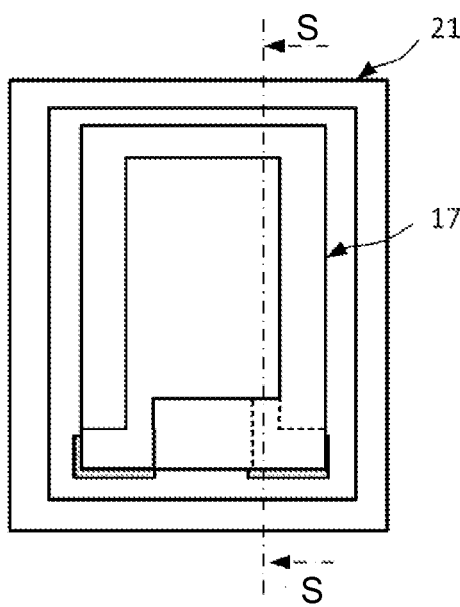
Figure 8E:
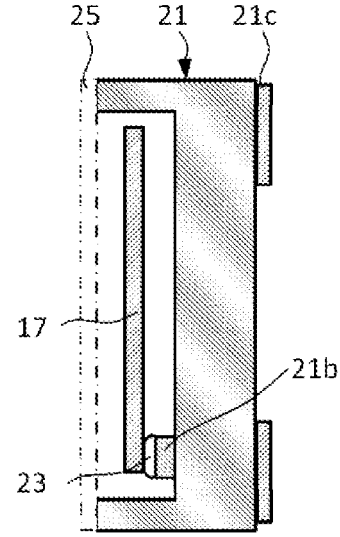

Next, the etching resist masks (ones left on the frame portions and similar portions) are removed from the quartz-crystal wafer after the above-described etching is performed to expose a crystal surface (see FIG. 6). After that, the well-known film formation method is used to form a metal film (not illustrated) for forming excitation electrodes and extraction electrodes of the crystal unit on the entire surface of the quartz-crystal wafer. Next, the well-known photolithography technique and metal etching technique are used to perform a patterning on the metal film in an electrode shape to form an electrode pattern 15 which includes an excitation electrode 15a and an extraction electrode 15b (see FIG. 7A, FIG. 7B, and FIG. 7C). This ensures obtaining crystal units 17 that include the crystal elements 11, the excitation electrodes 15a, and the extraction electrodes 15b (see FIG. 7A, FIG. 7B, and FIG. 7C).

Generally, a structure configured by mounting a crystal unit 17 in a preferable container is often referred to as a crystal unit. The following describes the typical example with reference to FIG. 8A to FIG. 8E. FIG. 8A to FIG. 8E illustrate a procedure of mounting the crystal unit 17 in a ceramic package 21 in plan views and cross-sectional views taken along the line S-S.

In the state illustrated in FIG. 7A, the crystal units 17 are connected to the quartz-crystal wafer 11w via connecting portions 11x. First, an appropriate external force is applied to the connecting portions 11x to separate the crystal units 17 from the quartz-crystal wafer 11w, thus separating the crystal units 17 into individual pieces (see FIG. 8A). Meanwhile, as the container, for example, a well-known ceramic package 21 is prepared. The ceramic package 21 in this case includes a depressed portion 21a (see FIG. 8B and FIG. 8C), which houses the crystal unit 17, a bump 21b for securing the crystal unit, which is disposed on the bottom surface of the depressed portion 21a, and mounting terminals 21c, which are disposed on the back surface of the ceramic package 21. The bumps 21b and the mounting terminals 21c are electrically connected with a via-wiring (not illustrated).

The crystal unit 17 is mounted in the depressed portion 21a of this ceramic package 21. In detail, a conductive adhesive material 23 (see FIG. 8E) is applied over the bump 21b. This adhesive material 23 secures the crystal unit 17 to the bump 21b at the site of the extraction electrode 15b. Afterwards, the oscillation frequency of the crystal element 11 is adjusted to a predetermined value by the well-known method. Subsequently, the inside of the depressed portion 21a of the ceramic package 21 is placed into appropriate vacuum or inert gas atmosphere or a similar atmosphere. After that, a lid 25 seals the depressed portion 21a by the well-known method. Thus, the crystal unit with a structure where the crystal resonator is housed in the ceramic package 21 is obtained.

3. Explanation of Experimental Results

Figure 10:
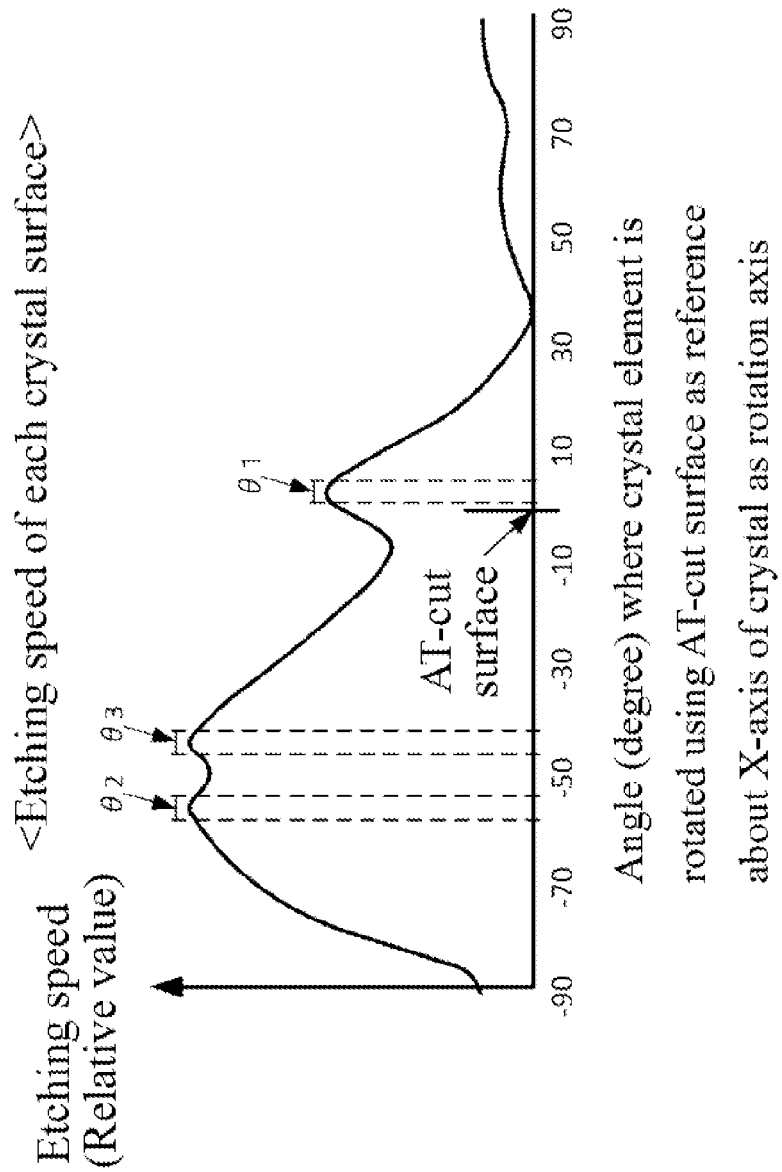
FIG. 10 is an explanatory drawing of the experimental results continuous from FIG. 9 according to this disclosure.

The following describes the experimental results with reference to FIG. 9 and FIG. 10. FIG. 9 is a drawing describing how the impedances of the crystal units 17 configured using the crystal elements differ depending on the difference in the shape of the Z'-surfaces of the crystal elements. The horizontal axis indicates sample numbers of the crystal elements used in the experiment and characteristics of the shapes of the Z'-surfaces of the respective samples, and the vertical axis indicates the impedance. The oscillation frequency of the experimental samples is close to 38 MHz. Table 1 shows details of the frequencies and the impedances.

TABLE 1

| Sample Number | Oscillation Frequency (MHz) | Impedance ($\Omega$) | Remarks |
|---|---|---|---|
| 1 | 38.54349677 | 260.49 | Sample where the protrusion remains |
| 2 | 38.54670424 | 205.78 | Sample where the protrusion remains |
| 3 | 38.55282675 | 421.39 | Sample where the protrusion remains |
| 4 | 38.63510545 | 151.79 | Sample where the protrusion remains |
| 5 | 38.64255206 | 201.31 | Fourth surface generating sample |

TABLE 1-continued

| Sample Number | Oscillation Frequency (MHz) | Impedance (Ω) | Remarks |
|---|---|---|---|
| 6 | 38.66838059 | 584.4 | Fourth surface generating sample |
| 7 | 38.70607843 | 230.85 | Fourth surface generating sample |
| 8 | 38.66896606 | 79.969 | Sample of this disclosure |
| 9 | 38.69384575 | 73.843 | Sample of this disclosure |

As apparent from FIG. 9, the impedances of the samples leaving the protrusion on the Z'-surface of the crystal element are around 150Ω to 400Ω. The impedances of the samples having the Z'-surface of the crystal element constituted of the four first to fourth surfaces are around 200Ω to 600Ω. In contrast to these, the impedances of the samples within the range of this disclosure where the Z'-surface of the crystal element has the three of the first to third surfaces and the angles θ1 to θ3 (see FIG. 1C) formed by the respective surfaces with respect to the AT-cut principal surface are at the predetermined angles are around 80Ω. It can be seen that the impedances of these samples within the range of this disclosure decrease to values equal to or less than half of those of the former two samples.

FIG. 10 is an explanatory drawing illustrating the first to the third surfaces 11a, 11b, and 11c according to this disclosure. Specifically, FIG. 10 shows the experimental results by the inventors according to this application, and shows the difference of the etching speed in various crystal surfaces of the crystal with a hydrofluoric acid-based etchant. More specifically, FIG. 10 indicates the angles where the AT-cut principal surface as a reference is rotated about the X-axis of the crystal as a rotation axis on the horizontal axis, and indicates the etching speeds of the respective crystal surfaces obtained by rotating an AT-cut plate as described above on the vertical axis. The etching speeds of the respective surfaces are indicated by relative values with respect to the etching speed of the AT-cut surface.

As apparent from FIG. 10, it has found that the crystal has the maximum etching speed on each surface of a surface corresponding to a surface where the AT-cut principal surface is rotated by θ1, a surface corresponding to a surface where the AT-cut principal surface is rotated by θ2, and a surface corresponding to a surface where the AT-cut principal surface is rotated by θ3. Then, θ1 is near 4°, θ2 is near −57°, and θ3 is near −42°. Furthermore, the experiments by the inventor have found that, in the regions where the impedance is good described with reference to FIG. 9, the angles are as follows: θ1=4°±3.5°, θ2=−57°±5°, and θ3=−42°±5°, and more preferably, θ1=4°±3°, θ2=−57°±3°, and θ3=−42°±3°. Each surface specified by these θ1 to θ3 corresponds to the first to the third surfaces according to this disclosure. As described above, changing the composition of the etchant used to form the outer shape of the crystal element can change and control the angle θ1 within the above-described range of the angle. The same goes for the angles θ2 and θ3.

4. Finite Element Method Analysis and Experimental Results 4-1. Analysis by Finite Element Method The following describes an optimization of the angle θ1 formed by the first surface 11a and the principal surface 11d and the ratio M=D/t, which is the ratio of the length D of the first surface 11a to the thickness t at the part of the principal surface 11d of the crystal element 11.

Figure 19:
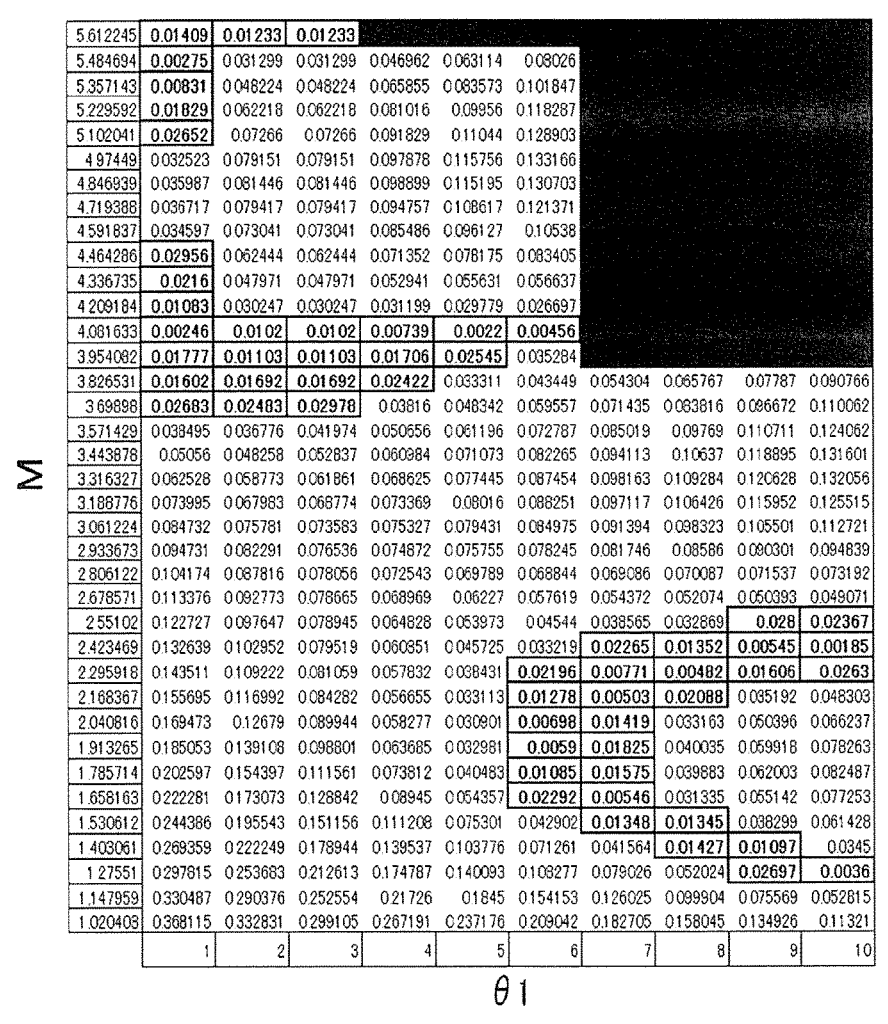

Focusing on a conversion percentage fn (M, (θ1)) from a thickness twist vibration of the crystal element 11 (a main vibration, a vibration equivalent to a propagation mode of a thickness-shear vibration in the Z'-direction, which is the main vibration of the AT-cut crystal unit) to a surface-shear vibration (an unnecessary vibration) as a parameter for optimization, and following a concept of "Method for Deriving Conversion Percentage" described later, how the conversion percentage fn (M, (θ1)) is changed by θ1 and M is obtained by the finite element method analysis. FIG. 19 shows the results. It can be seen that the change in one or both of θ1 and M changes the conversion percentage fn (M, (θ1)). The smaller conversion percentage fn (M, (θ1)) means a small influence of the surface-shear vibration given to the thickness twist vibration, meaning excellent in improvement of the property of the crystal unit. According to study by the inventor of this application, the following has been found. With the conversion percentage fn (M, (θ1)) of 0.104 or less, or more preferably 0.07 or less, a crystal unit practically free from problems can be obtained. Additionally, even if the dimension in the Z'-direction of the crystal element 11 (the Z' dimension) is changed more or less, the crystal unit is less likely to change the properties, that is, a freedom of design of the Z' dimension of the crystal element 11 is enhanced. It has been found that the conversion percentage fn (M, (θ1)) is further preferable to be 0.05 or less and more preferable to be 0.033 or less (see the explanation described later with reference to FIG. 12, FIG. 15A, FIG. 15B, FIG. 17A, FIG. 17B, and a similar drawing).

Figure 11:
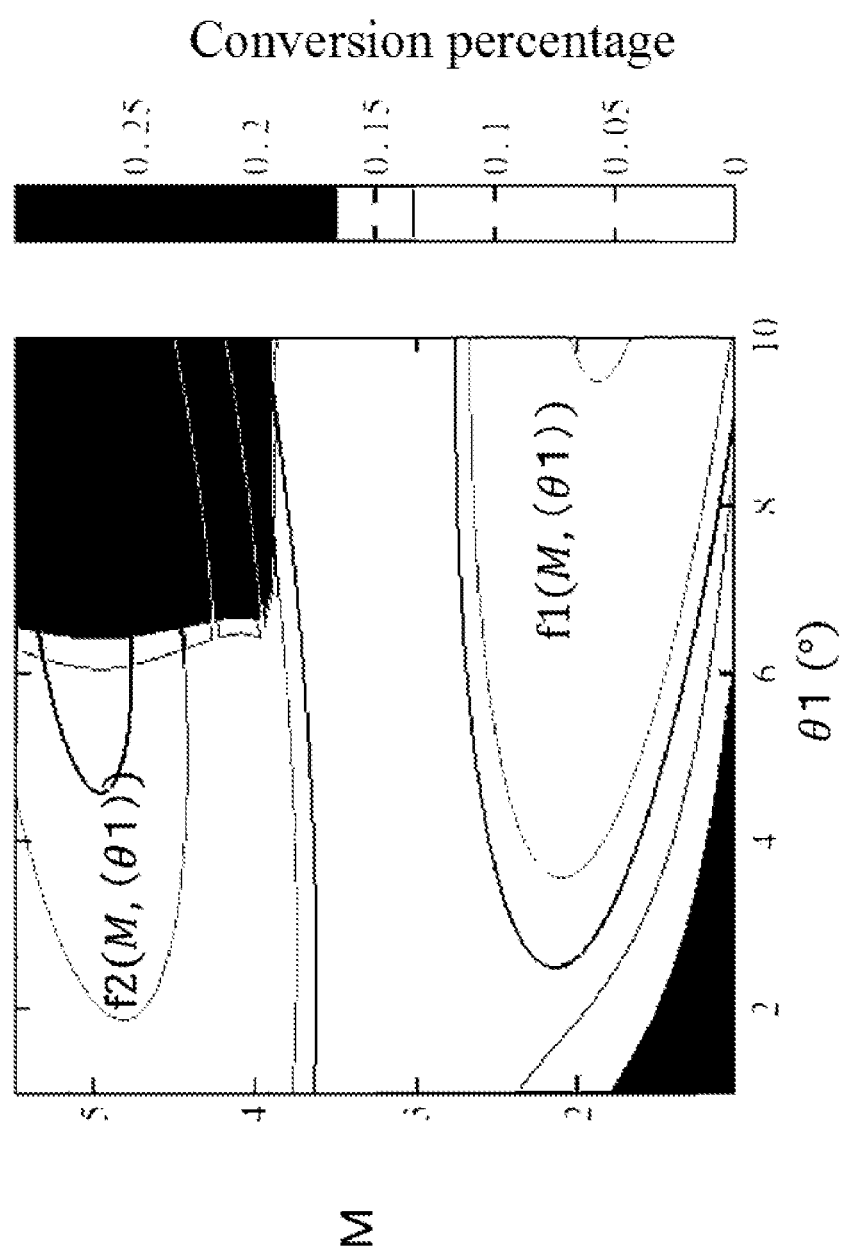
FIG. 11 is a drawing describing a conversion percentage.

FIG. 19 is a drawing describing the Conversion Percentage Distribution Table. From such aspect, for example, to divide only parts with the conversion percentage of 0.03 or less, the conversion percentage distribution in FIG. 19 surrounds the corresponding columns with frames and describes the characters in the frames with bold face. Then, regions of the conversion percentage indicative of 0.03 or less appear in some respective regions on upper left half and lower right half in FIG. 19. With such concept, dividedly illustrating the conversion percentage distribution with line such as a contour line obtains a distribution diagram like FIG. 11. Dividing this distribution diagram by the formula, conversion percentage fn (M, (θ1)), ensures dividing the distribution diagram into regions for f1 (M, (θ1)) and f2 (M, (θ1)) as illustrated in FIG. 11. Studies by the inventor have found that, to divide this conversion percentage distribution by desired conversion percentages, it is only necessary to perform the following-described Formula (1) and Formula (2). The "Th" in Formula (1) and Formula (2) is a threshold with respect to the conversion percentage. The selection of θ1 and/or M such that the results of these Formula (1) and Formula (2) meet, for example: the threshold Th of 0.104 or less, preferably 0.07 or less, more preferably 0.05 or less, and further preferably 0.033 or less, ensures achieving the crystal unit with large freedom of design. Note that, since the thickness t of the part of the crystal element 11 holding the principal surface 11d is the value of determining a nominal frequency of the crystal element, the thickness t is restricted by the nominal frequency. Therefore, mainly changing the dimension D of the first surface 11a along the Z'-axis of the crystal can change the ratio M. As described above, displacing the etching resist masks 13, which are used in the crystal etching process (see the process in FIG. 2A to FIG. 3B) to obtain the crystal element, in the Z'-direction on the front and back of the wafer can control this dimension D. Meanwhile, changing the composition of the etchant used during the crystal etching can control the angle θ1. Devising these manufacturing conditions ensures designing θ1 and M such that the conversion percentage becomes the predetermined value or less.

Figure 12:
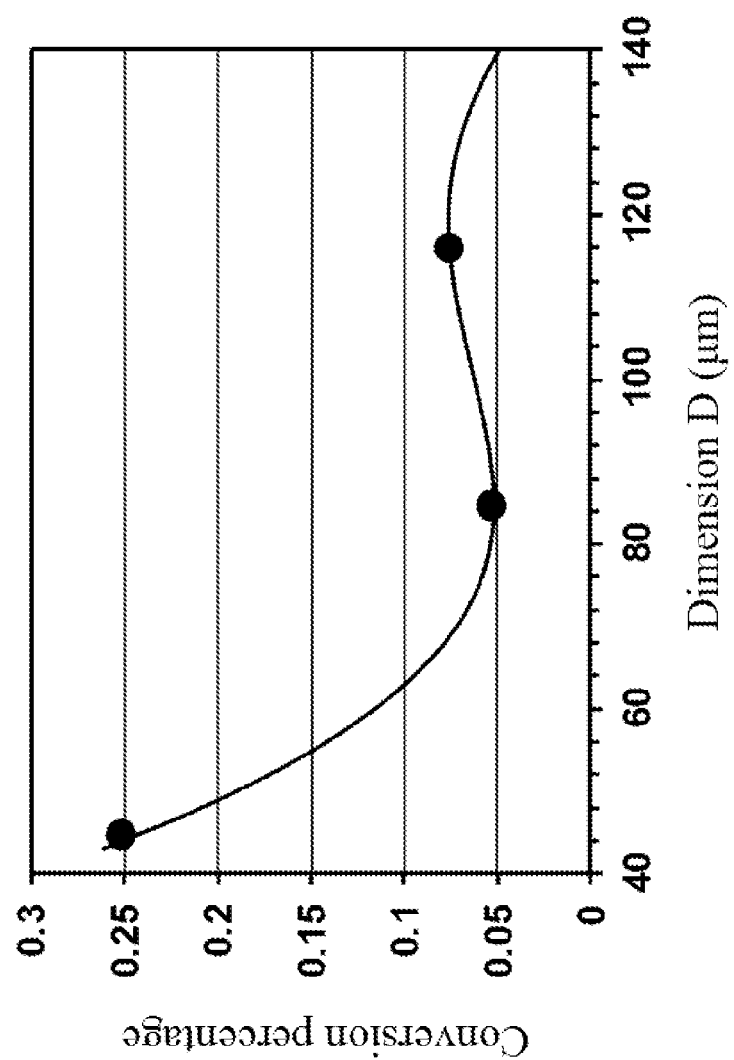
FIG. 12 is a drawing describing a relationship between a dimension D and the conversion percentage.

FIG. 12 is a concrete example of the analysis results. That is, in FIG. 12, the nominal frequency is fixed at 38 MHz (accordingly, the thickness t is a value corresponding to this frequency), and the angle θ1=4.5 degrees, the angle θ2=−57.0 degrees, and the angle θ3=−41.8 degrees are fixed. Then, the dimension D is changed, and the conversion percentage is calculated by the finite element method analysis (the following derivation method). Thus, FIG. 12 plots the relationship between the dimension D and the conversion percentage. In FIG. 12, the horizontal axis indicates the dimension D, and the vertical axis indicates the conversion percentage. It has been found from FIG. 12 that the conversion percentage becomes a low value, 0.07 or less, at the dimension D close to 70 μm to 110 μm, and especially the conversion percentage becomes around 0.05 at the dimension D close to 85 μm, thus an extreme value is present.

Figure 13A:
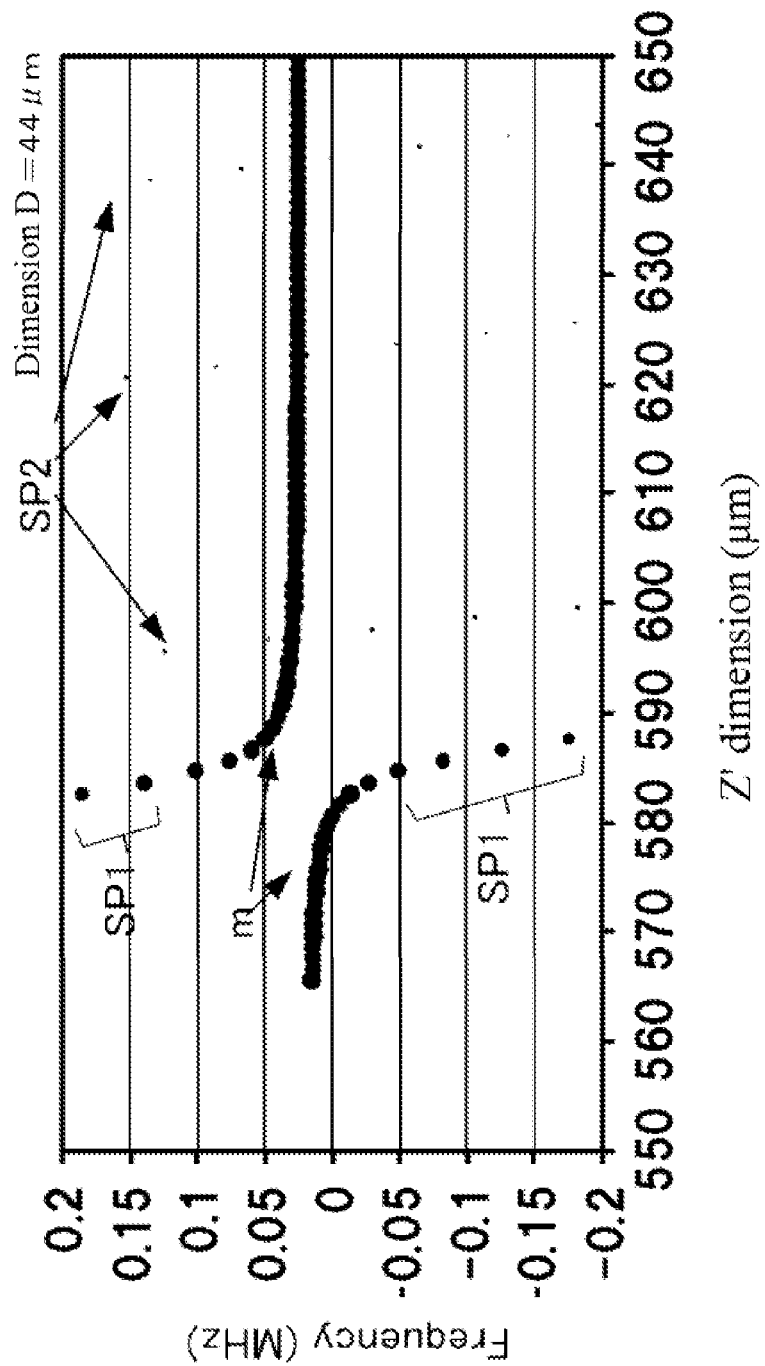
FIG. 13A, FIG. 13B, and FIG. 13C are mode charts of respective crystal unit models with different dimensions D by finite element method analysis.
Figure 13B:
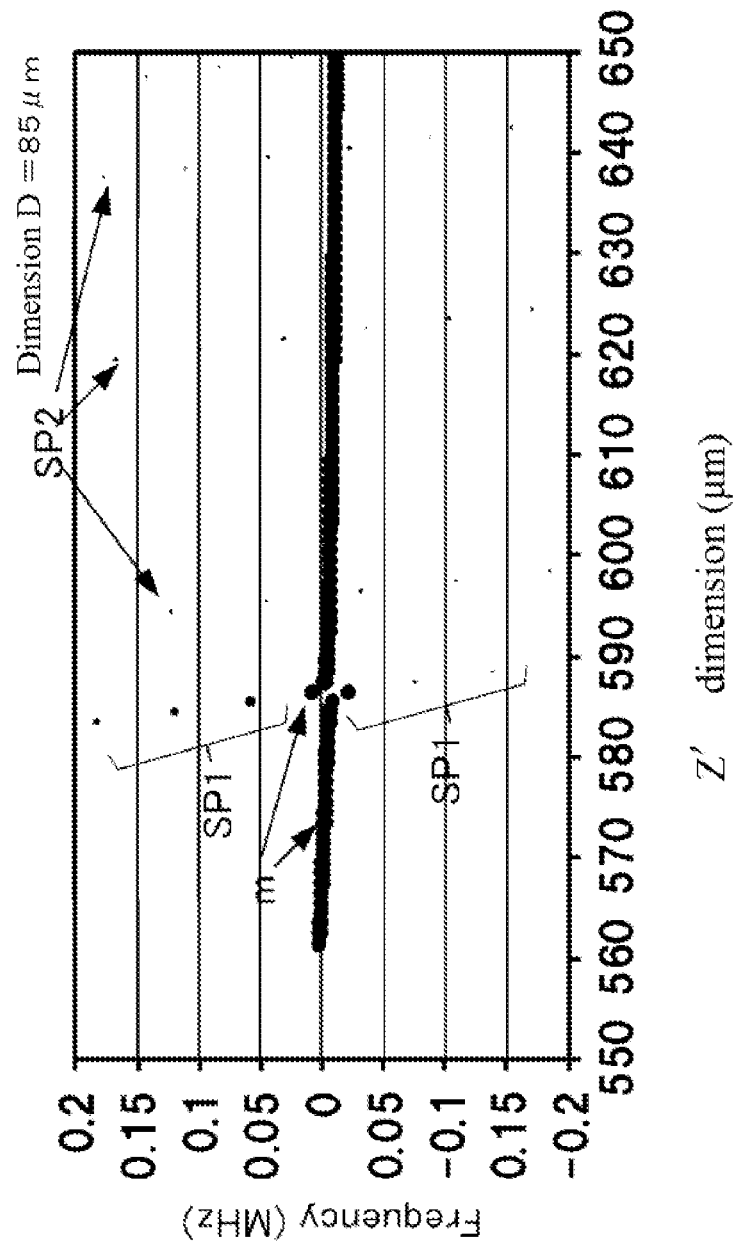
Figure 13C:
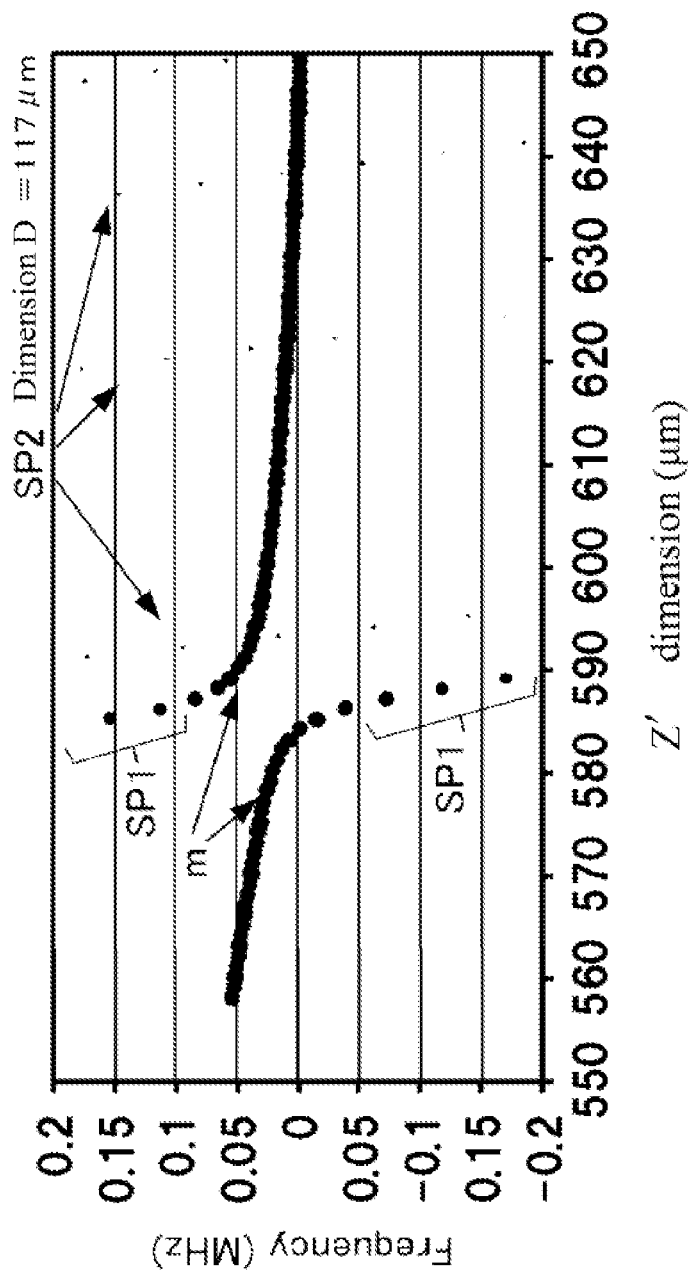

FIG. 13A to FIG. 13C illustrate mode charts that analyze the crystal units at three respective levels, the dimension D of the first surface at 44 μm, 85 μm, and 117 μm (near black circles in FIG. 12), under the conditions described with reference to FIG. 12 by the finite element method. In FIG. 13A to FIG. 13C, the horizontal axis indicates the Z' dimension of the crystal element 11, and the vertical axis indicates an amount of change in vibration frequency of the crystal element (unit: MHz). The amount of change in vibration frequency means a difference between a reference frequency, which is a main vibration frequency at the crystal unit with the dimension D of the first surface=85 μm and the Z' dimension of the crystal element=550 μm, and a frequency at each crystal unit with the dimension D and the Z' dimension different from those of the crystal unit for the reference frequency. In FIG. 13A to FIG. 13C, the curved line indicated by in means a thickness twist vibration mode (a main vibration mode), the curved line indicated by SP1 means a surface-shear vibration mode (an unnecessary mode), and the curved line indicated by SP2 is an unnecessary mode such as a flexure vibration mode and a longitudinal vibration mode.

As apparent through comparison between FIG. 13A to FIG. 13C, it has been found that, at the level setting the dimension D to a value in the proper range (the level of D=85 μm), even if the Z' dimension is differentiated in the range of 550 μm to 650 μm, the vibrations in the unnecessary mode are less likely to occur compared with the other levels. Therefore, it is found that the freedom of design of the Z' dimension can be largely provided.

Method for Deriving Conversion Percentage

The following describes the method for deriving the conversion percentage described in this application. A correspondence relationship between terms used in the following description and signs in respective formulas is as shown in the following Table 2.

Expressing energies of respective incident waves and reflected waves in the thickness twist vibration and the surface-shear vibration by the signs in Table 2, a relationship between the incident wave and the reflected wave can be defined by the following formula (a) using a reflection coefficient matrix Γ.

Accordingly, the reflection coefficient matrix Γ can be obtained by the following formula (b).

$$\begin{pmatrix} p_{out}^{TT} \\ p_{out}^{FS} \end{pmatrix} = \begin{pmatrix} \Gamma_{TT\,TT} & \Gamma_{TT\,FS} \\ \Gamma_{FS\,TT} & \Gamma_{FS\,FS} \end{pmatrix} \begin{pmatrix} p_{in}^{TT} \\ p_{in}^{FS} \end{pmatrix} \quad (a)$$

$$\begin{pmatrix} \Gamma_{TT\,TT} & \Gamma_{TT\,FS} \\ \Gamma_{FS\,TT} & \Gamma_{FS\,FS} \end{pmatrix} = \begin{pmatrix} p_{out}^{TT(1)} & p_{out}^{TT(2)} \\ p_{out}^{FS(1)} & p_{out}^{FS(2)} \end{pmatrix} \begin{pmatrix} p_{in}^{TT(1)} & p_{in}^{TT(2)} \\ p_{in}^{FS(1)} & p_{in}^{FS(2)} \end{pmatrix}^{-1} \quad (b)$$

The incident wave 1, the incident wave 2, the reflected wave 1, and the reflected wave 2 (see the signs shown in Table 2) in the formula (b) are obtained as follows.

Figure 14:
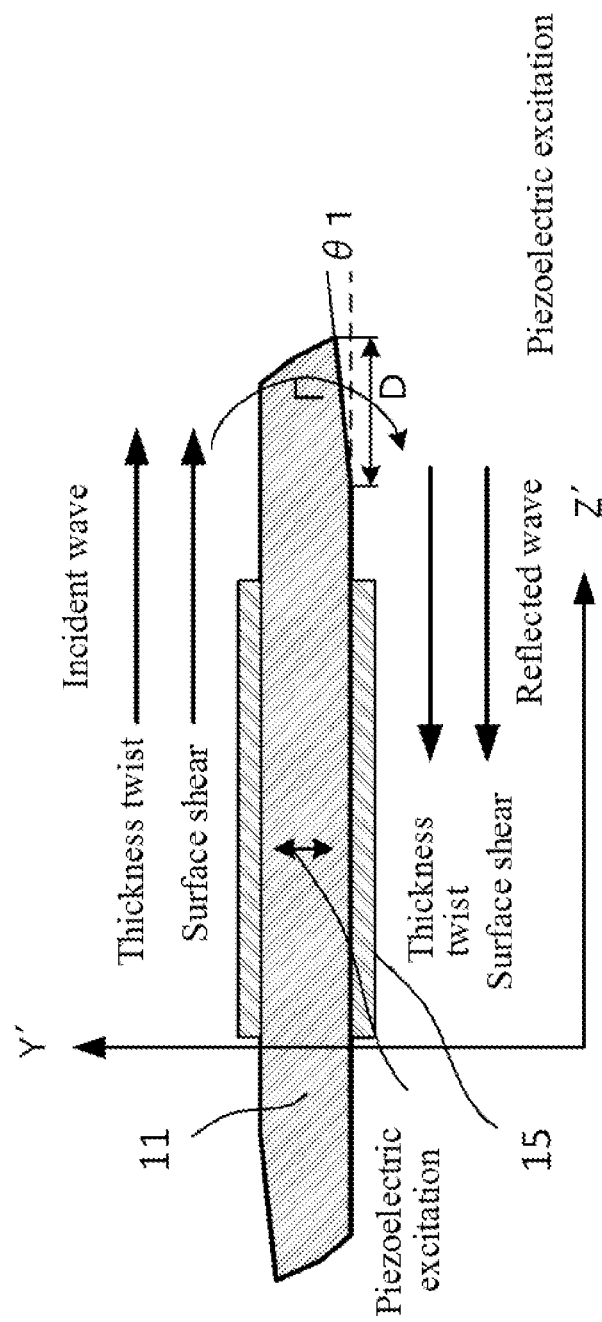
FIG. 14 is a drawing describing a method for deriving the conversion percentage.

That is, the calculation is performed on a model of the crystal unit as illustrated in FIG. 14 using the finite element method analysis to obtain respective amplitudes.

The incident waves and the reflected waves in the respective thickness twist and surface shear are separated from the obtained amplitudes. The incident wave 1 and the reflected wave 1 can be calculated from the obtained amplitudes. Similarly, the amplitudes are calculated from a model where a length of a piezoelectric excitation unit is changed, thus obtaining the incident wave 2 and the reflected wave 2 from the obtained amplitudes. These values are assigned to the above-described formula (b), thus obtaining the reflection coefficient matrix F. Among these values, an off-diagonal element 1 in the reflection coefficient matrix and an off-diagonal element 2 (see the signs in Table 2) in the reflection coefficient matrix are magnitudes converted into another mode at the reflection, namely, the conversion percentage. Since these absolute values are equal, the off-diagonal element 1 in the reflection coefficient matrix is indicated as the conversion percentage F (M, (θ1)).

TABLE 2

| Term | Sign |
|---|---|
| Energy of incident wave in thickness twist vibration | $p_{in}^{TT}$ |
| Energy of reflected wave in thickness twist vibration | $p_{out}^{TT}$ |
| Energy of incident wave in surface-share vibration | $p_{in}^{FS}$ |
| Energy of reflected wave in surface-share vibration | $p_{out}^{FS}$ |
| Incident wave | $\begin{pmatrix} p_{in}^{TT} \\ p_{in}^{FS} \end{pmatrix}$ |
| Reflected wave | $\begin{pmatrix} p_{out}^{TT} \\ p_{out}^{FS} \end{pmatrix}$ |
| Reflection coefficient matrix | $\Gamma = \begin{pmatrix} \Gamma_{TT\,TT} & \Gamma_{TT\,FS} \\ \Gamma_{FS\,TT} & \Gamma_{FS\,FS} \end{pmatrix}$ |
| Incident wave 1 | $\begin{pmatrix} p_{in}^{TT(1)} \\ p_{in}^{FS(1)} \end{pmatrix}$ |
| Incident wave 2 | $\begin{pmatrix} p_{in}^{TT(2)} \\ p_{in}^{FS(2)} \end{pmatrix}$ |
| Reflected wave 1 | $\begin{pmatrix} p_{out}^{TT(1)} \\ p_{out}^{FS(1)} \end{pmatrix}$ |
| Reflected wave 2 | $\begin{pmatrix} p_{out}^{TT(2)} \\ p_{out}^{FS(2)} \end{pmatrix}$ |

TABLE 2-continued

| Term | Sign |
| --- | --- |
| Off-diagonal element 1 in reflection coefficient matrix | $\Gamma_{TT\,FS}$ |
| Off-diagonal element 2 in reflection coefficient matrix | $\Gamma_{FSTT}$ |

4-2. Experimental Results Corresponding to Analysis Results

To confirm whether the above-described analysis results are good or bad, the following experiment was conducted.

4-2-1. Prototype of Crystal Unit with Nominal Frequency of 52 MHz

Figure 15A:
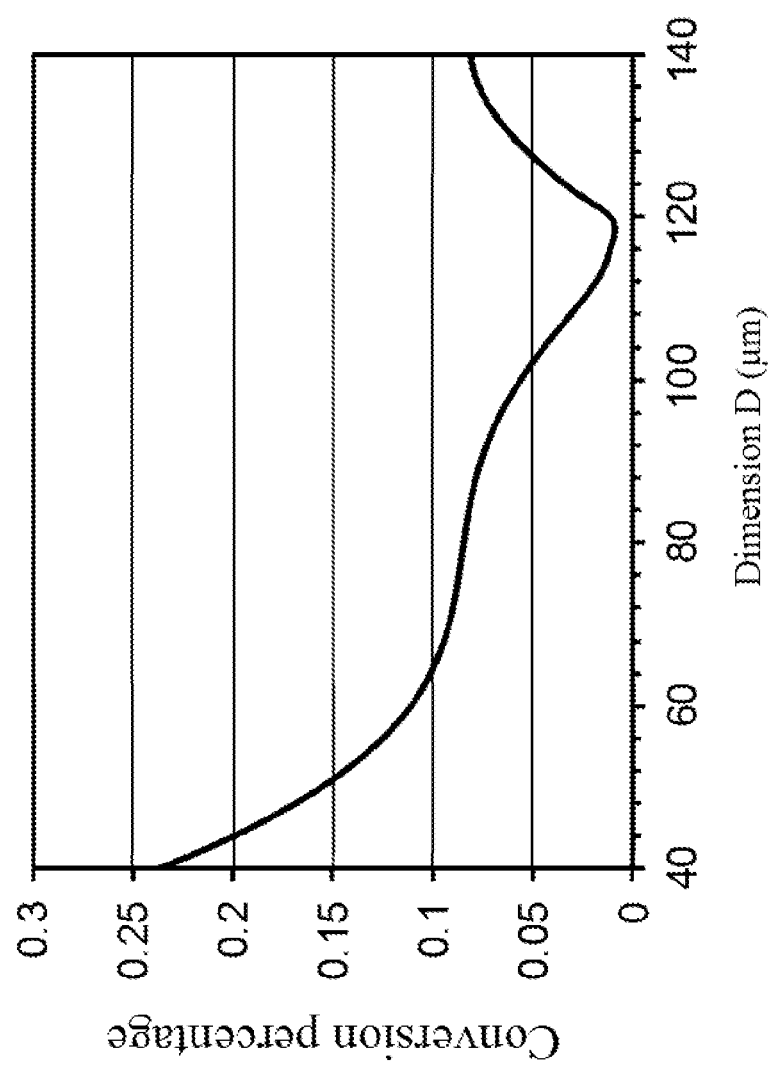
FIG. 15A is a drawing describing a relationship between the dimension D and the conversion percentage of another crystal unit model.

The crystal units with nominal frequency of 52 MHz whose package size is a so-called 1612 size were configured to have the angle θ1=2.5°, the angle θ2=−59.0°, and the angle θ3=−40.7° to preliminary examine the relationship between the dimension D and the conversion percentage by the finite element method analysis. FIG. 15A shows the results. In FIG. 15A, the horizontal axis indicates the dimension D and the vertical axis indicates the conversion percentage. It can be seen from FIG. 15A that the conversion percentage becomes the minimum, around 0.01, at the dimension D=around 116 μm to 121 μm.

Figure 15B:
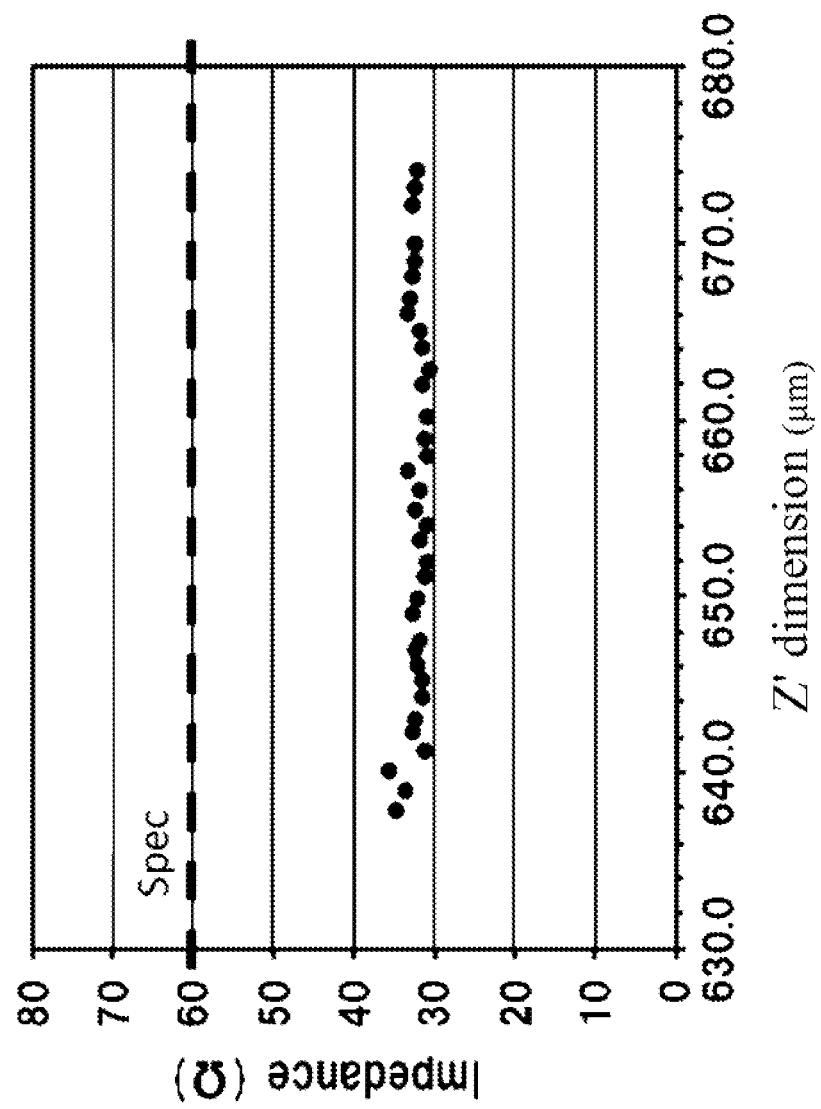
FIG. 15B is a drawing describing a property of a crystal unit prototyped on based on this model.
Figure 16A:
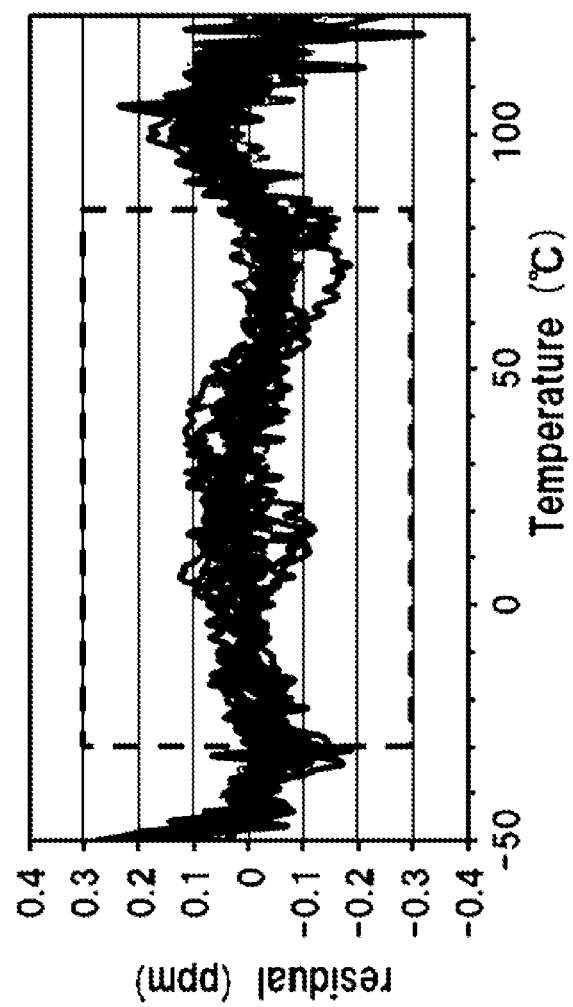
FIG. 16A is a drawing describing a frequency versus temperature characteristic of the prototyped crystal unit.
Figure 16B:
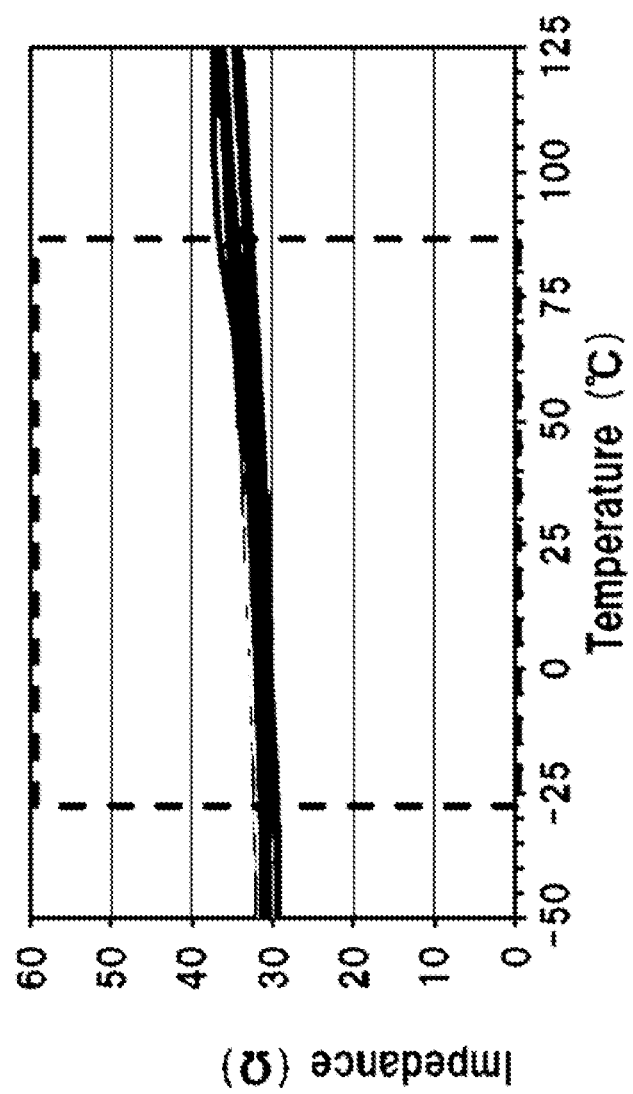
FIG. 16B is a drawing describing a temperature characteristic of an impedance in the crystal unit.

Therefore, crystal units with the dimension D of 116 μm to 121 μm were actually prototyped to examine the properties. The number of prototypes is 30 pieces. FIG. 15B is an example of the examination results that plots the relationship between the Z' dimension of the crystal element and the impedance of the crystal unit (so-called crystal impedance). That is, FIG. 15B is a mode chart focusing on the impedance. In FIG. 15B, the horizontal axis indicates the Z' dimension (μm), the vertical axis indicates the impedance (Ω), and the "Spec" in the drawing indicates an impedance standard. It is found that, as apparent from FIG. 15B, the selection of the dimension D such that the conversion percentage decreases obtains the flat mode chart across 30 μm in the range of 641 μm to 672 μm of the Z' dimension. Temperature properties of these crystal units were measured. FIG. 16A and FIG. 16B show the results. FIG. 16A illustrates a frequency versus temperature characteristic shown with a temperature (° C.) on the horizontal axis and an amount of frequency variation (ppm) on the vertical axis. Note that, the amount of frequency variation in FIG. 16A is a difference (residual) between a frequency Fa at each measurement temperature and a frequency Fb. The frequency Fa is found from an approximation formula obtained from frequency versus temperature characteristic data actually measured on the respective crystal units. The frequency Fb is a frequency acutely measured at these measurement temperatures. FIG. 16B illustrates a temperature characteristic of impedance shown with a temperature (° C.) on the horizontal axis and an impedance (Ω) actually measured at the temperature on the vertical axis. The dashed square fames in FIG. 16A and FIG. 16B indicate standards on the amount of frequency variation and the impedance, respectively. It is apparent from these drawings that the respective prototyped crystal units all exhibit the frequency variation and the variation of impedance within the standards and further do not cause Dip (an abnormal variation), thereby having good properties.

4-2-2. Relationship between Dimension D, Conversion Percentage, and Impedance

Figure 17A:
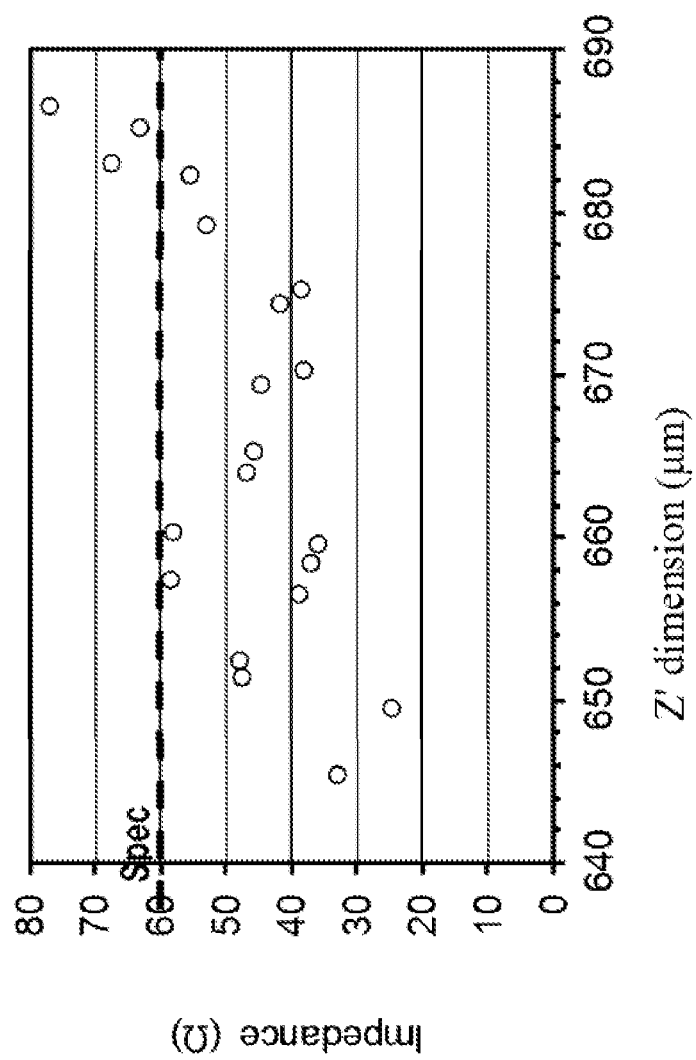
FIG. 17A and FIG. 17B are drawings describing a relationship between the dimension D, the conversion percentage, and the impedance in yet another crystal unit model.
Figure 17B:
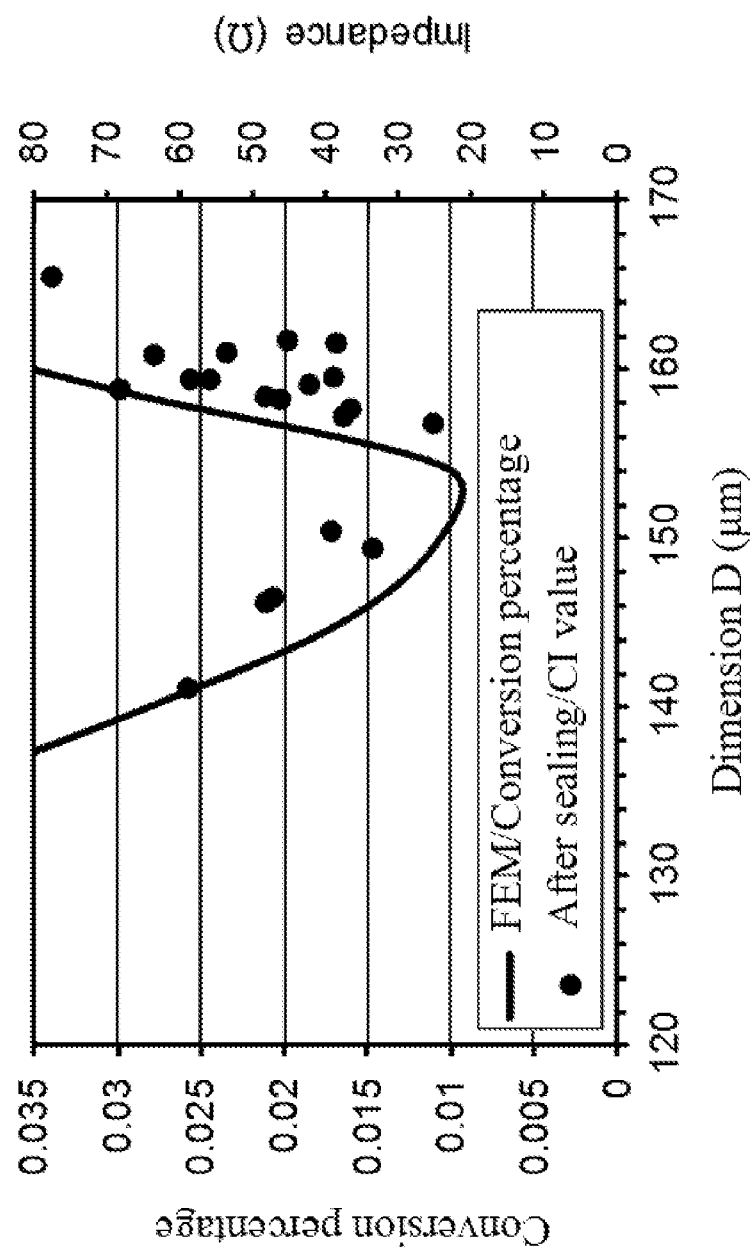

Crystal units with nominal frequency of 40 MHz whose package size is a so-called 1210 size were prototyped so as to have the angle θ1=2.6°, the angle θ2=−59.0°, the angle θ3=−40.7°, a target Z' dimension=645 μm to 690 μm, and a target dimension D=140 μm to 165 μm. The number of samples is 20 pieces. The impedance after sealing was measured to examine the relationship between the impedance and the Z' dimension. FIG. 17A summarizes results of the examinations and indicates the Z' dimension on the horizontal axis and the impedance of the crystal unit on the vertical axis. The "Spec" in FIG. 17A indicates the impedance standard. As apparent from FIG. 17A, regardless of the size of the Z' dimension, the impedances of some samples decrease. Accordingly, the relationship between the dimension D and the impedance and the relationship between the dimension D and the conversion percentage were examined. FIG. 17B summarizes results of the examinations and indicates the dimension D on the horizontal axis, the conversion percentage on the left vertical axis, and the impedance on the right vertical axis to show these relationships. It is apparent from FIG. 17B that the dimension D affects both the conversion percentage and the impedance. Specifically, it is found that, in the case of these prototype conditions, both the conversion percentage and the impedance become the minimum at the dimension D close to 155 μm. From this finding as well, it can be seen that the dimension D affects the properties of the crystal unit.

5. Other Embodiments

While the embodiment of the AT-cut crystal element and the crystal unit that employs the AT-cut crystal element according to this disclosure is described above, this disclosure is not limited to the above-described embodiment. For example, in the above-described example, while the configuration where the side surfaces of both ends in the Z'-direction are constituted of the three of the first to third surfaces according to this disclosure is described, in some cases, only one side surface may be constituted of the three surfaces of the first to the third surfaces. However, the configuration where both the side surfaces are constituted of the three surfaces of the first to the third surfaces provides the crystal unit with more excellent properties. While in the above-described example, the crystal units with the frequency close to 38 MHz, 40 MHz, and 52 MHz are employed; however, this disclosure is applicable to crystal units with other frequencies.

In the above-described exemplary manufacturing method, the parts of the etching resist masks 13 (see FIG. 2A and FIG. 2B) corresponding to the outer shapes of the crystal elements are formed so as to be opposed to one another on the front and back of the quartz-crystal wafer. However, the parts of the etching resist masks corresponding to the outer shapes of the crystal elements may be displaced by ΔZ along the Z'-direction between the front and the back of the quartz-crystal wafer. As for the as the displacement direction, the front and back masks are relatively displaced such that the etching resist mask disposed on the +Y'-surface side of the crystal element is displaced by ΔZ with respect to the etching resist mask disposed on the −Y'-surface side in the +Z'-direction. Thus, in the case where the mask displacement is performed, the Z'-surface of the crystal element can be formed in the shape constituted of the three surfaces of the first to the third surfaces in a short etching period compared with the case where the mask displacement is not performed. There is also an advantage that the length D (see FIG. 5C) of the first surface 11a in the Z'-direction can be controlled by this displacement amount.

Figure 18A:
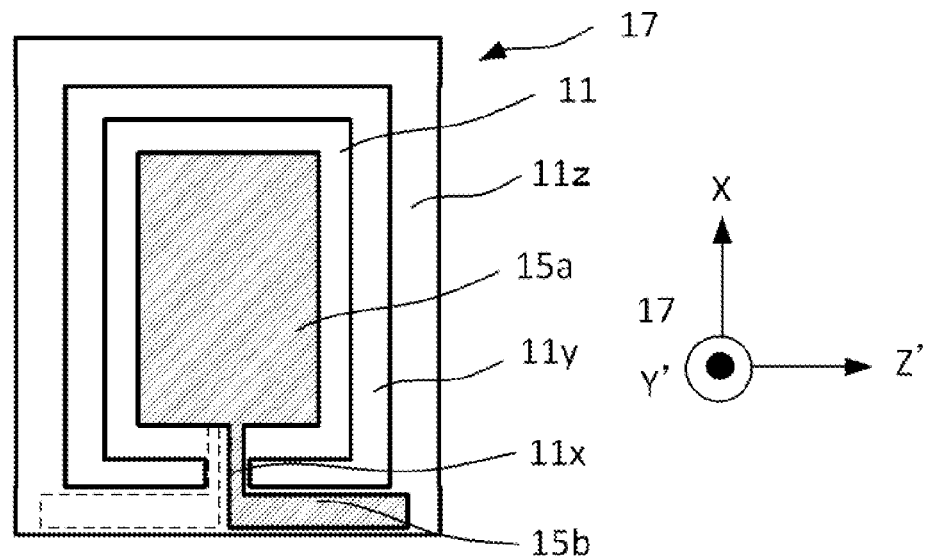
FIG. 18A and FIG. 18B are explanatory drawings of another embodiment.
Figure 18B:
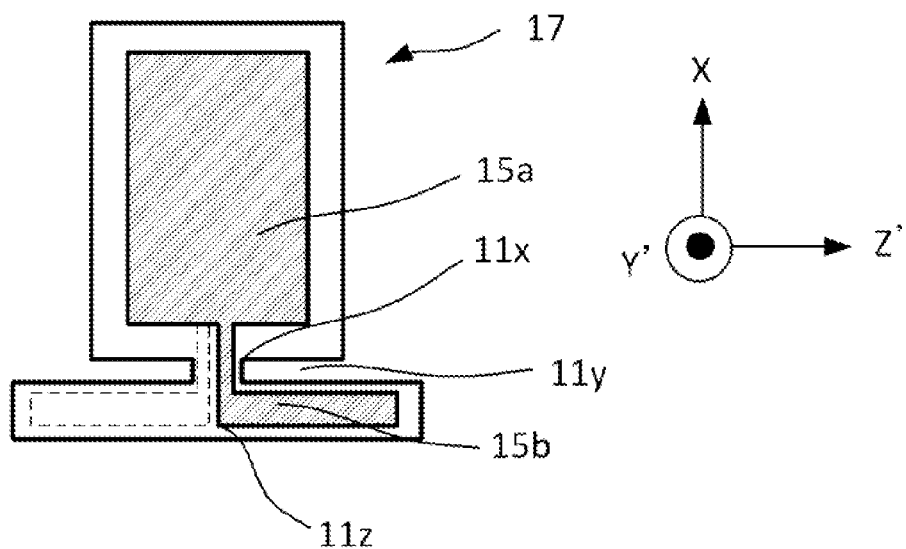

The AT-cut crystal element and the crystal unit according to this disclosure may have the structure illustrated in FIG. 18A and FIG. 18B. Firstly, as illustrated in FIG. 18A, the AT-cut crystal element and the crystal unit are: the crystal element 11 according to the disclosure, a crystal element that includes a frame portion 11z and one connecting portion 11x, and the crystal unit that includes the crystal element. The frame portion 11z is integrally formed with the crystal element 11, and the entire frame portion 11z boxes the crystal element 11 separated by a through portion 11y. The connecting portion 11x is also integrally formed with the crystal element 11, and connects the crystal element to the frame portion. As illustrated in FIG. 18B, the AT-cut crystal element and the crystal unit are: the crystal element 11 according to the disclosure, a crystal element that includes the frame portion 11z and the one connecting portion 11x, and the crystal unit that includes the crystal element. The frame portion 11z is integrally formed with the crystal element, and a part of the frame portion 11z boxes the crystal element 11 separated by the through portion 11y. The connecting portion 11x is also integrally formed with the crystal element 11, and connects the crystal element to the frame portion. The connecting portion may be disposed two or more. However, the configuration of one connecting portion reduces a leakage of vibration from the crystal element 11 to the frame portion and the influence of stress from the frame portion to the crystal element easily. The position where the connecting portion 11x is disposed is not limited to the example in FIG. 18A and FIG. 18B. The position can be changed according to the design.

The above-described example shows the example of the crystal element having the sides along the X-axis of the crystal as the long sides and the sides along the Z'-axis as the short sides. However, this disclosure is also applicable to a crystal element having sides along the X-axis of the crystal as short sides and sides along the Z'-axis as long sides. The above-described example describes the example of the rectangular crystal element in planar shape. However, the disclosure also incorporates an approximately rectangular-shaped crystal element that has corner portions to which an R processing or a C processing is performed.

According to another aspect of this disclosure, there is provided an AT-cut crystal element that has at least one of two side surfaces (namely, a Z'-surface) intersecting with a Z'-axis of a crystallographic axis of a crystal constituted of three of first to third surfaces. The first to the third surfaces meet following conditions (a) to (e):

(a) The first to the third surfaces intersect with one another in this order.
(b) The first surface is a surface equivalent to a surface formed by rotating an X-Z'-surface (a principal surface of the crystal element) expressed by the crystallographic axis of the crystal of the AT-cut crystal element by 4°±3.5° about an X-axis of the crystal as a rotation axis.
(c) The second surface is a surface equivalent to a surface formed by rotating the principal surface by −57.5°±3.5° about the X-axis of the crystal as the rotation axis.
(d) The third surface is a surface equivalent to a surface formed by rotating the principal surface by −42°±3.5° about the X-axis of the crystal as the rotation axis.
(e) Expressing the angle (the angle close to 4°) of the first surface as θ1, a length of the first surface along a Z'-direction of the crystal as D, a thickness of a part of the crystal element having the principal surface as t, and M=D/t, and a conversion percentage from a thickness twist vibration to a surface-shear vibration of the crystal element as fn (M, (θ1)) (where, n=1 or 2), the θ1 and the M are set such that the conversion percentage fn (M, (θ1)) becomes a predetermined value Th or less.

The negative of −57° and −42° means the clockwise rotation of the crystal element of this disclosure about the X-axis of the crystal as its rotation axis when the crystal element is viewed from the cross section on the −X-surface of the crystal (the cross section viewed from the −X-side) (see FIG. 1B and FIG. 1C) (the same is applied hereinafter). Viewing the crystal element of this disclosure from the cross section on the +X-surface (from the back surface in the paper of FIG. 1B and FIG. 1C), the rotation direction is the opposite direction.

To embody this disclosure, the following is preferable. The θ1 and the M are set to meet a following formula (1) or formula (2). The threshold Th is good to be 0.104, preferable to be 0.07, more preferable to be 0.05, and further preferable to be 0.033.

$$f_1(M, \theta_1) = |-0.0015652(\theta_1)^2 + 0.075277838(\theta_1) - 0.214462646M^2 + 0.958426958M - 0.01625357(\theta_1)M - 1.260251154| \leq Th \quad (1)$$

$$f_2(M, \theta_1) = |0.00191304(\theta_1)^2 + 0.035208543(\theta_1) + 0.117177852M^2 - 1.105007257M - 0.012260299(\theta_1)M + 2.575161001| \leq Th \quad (2)$$

To embody this disclosure, the following is more preferable. The first surface is a surface equivalent to a surface formed by rotating the principal surface by 4°±3° about the X-axis of the crystal as the rotation axis. The second surface is a surface equivalent to a surface formed by rotating the principal surface by −57°±3° about the X-axis of the crystal as the rotation axis. The third surface is a surface equivalent to a surface formed by rotating the principal surface by −42°±3° about the X-axis of the crystal as the rotation axis.

Additionally, to embody this disclosure, the following is preferable. Both of the two side surfaces of the AT-cut crystal element intersecting with a Z'-axis of a crystallographic axis of a crystal are constituted of the three of the first to third surfaces. More preferably, the two side surfaces are mutually disposed in a point symmetry with a center point of the AT-cut crystal element as a center (see FIG. 1B).

A crystal unit according to the disclosure includes the above-described AT-cut crystal element according to the disclosure and excitation electrodes to excite the crystal element. More specifically, the crystal unit includes the excitation electrodes on each of front and back of a principal surface (the X-Z' surface) of the crystal element, and includes extraction electrodes extracted from the excitation electrodes. Obviously, the crystal unit according to the disclosure includes a crystal unit in an aspect that further includes a container to house the crystal unit with the electrodes. The aspect thus housed in the container is a typical example of this crystal unit.

The AT-cut crystal element according to the disclosure includes the above-described crystal element according to the disclosure and a crystal element (hereinafter referred to as a framed crystal element) that includes a frame portion and one or two or more connecting portions. The frame portion is integrally formed with the crystal element. The entire or a part of the frame portion boxes the crystal element separated by a through portion. The connecting portion is also integrally formed with the crystal element, and connects the crystal element to the frame portion (see FIG. 18A and FIG. 18B). The crystal unit according to the disclosure includes a crystal unit that includes the above-described framed crystal element, the excitation electrodes, and the extraction electrodes, and further includes a crystal unit that includes a container to house the crystal unit.

With the AT-cut crystal element according to the embodiments, the AT-cut crystal element with the Z'-side surface formed of predetermined three surfaces having a further proper shape can be obtained.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. An AT-cut crystal element, comprising
a crystal element having two side surfaces, which are Z'-surfaces, intersecting with a Z'-axis of a crystallographic axis of a crystal, wherein
at least one of the two side surfaces is constituted of three surfaces, which are a first surface, a second surface and a third surface, and the first surface, the second surface and the third surface meeting following conditions (a) to (e):
(a) the first surface, the second surface and the third surface intersect with one another in this order;
(b) the first surface is a surface equivalent to a surface formed by rotating an X-Z'-surface, as a principal surface of the crystal element, expressed by the crystallographic axis of the crystal of the crystal element by 4°±3.5° about an X-axis of the crystal as a rotation axis;
(c) the second surface is a surface equivalent to a surface formed by rotating the principal surface by −57.5°±3.5° about the X-axis of the crystal as the rotation axis;
(d) the third surface is a surface equivalent to a surface formed by rotating the principal surface by −42°±3.5° about the X-axis of the crystal as the rotation axis; and
(e) expressing an angle which is the angle close to 4° of the first surface as θ1, a length of the first surface along a Z'-direction of the crystal as D, a thickness of a part of the crystal element having the principal surface as t, and M=D/t, and a conversion percentage from a thickness twist vibration to a surface-shear vibration of the crystal element as fn (M, (θ1)), where, n=1 or 2, the θ1 and the M are set such that the conversion percentage fn (M, (θ1)) becomes a predetermined value Th or less.

2. The AT-cut crystal element according to claim 1, wherein
the θ1 and the M are set to meet a following formula (1) or formula (2), where the Th is the predetermined value, $$f_1(M, \theta_1) = |-0.0015652(\theta_1)^2 + 0.075277838(\theta_1) - 0.214462646M^2 + 0.958426958M - 0.01625357(\theta_1)M - 1.260251154| \le Th \quad (1)$$

$$f_2(M, \theta_1) = |0.00191304(\theta_1)^2 + 0.035208543(\theta_1) + 0.117177852M^2 - 1.105007257M - 0.012260299(\theta_1)M + 2.575161001| \le Th. \quad (2)$$

3. The AT-cut crystal element according to claim 2, wherein
the predetermined value Th is 0.104.

4. The AT-cut crystal element according to claim 2, wherein
the predetermined value Th is 0.07.

5. The AT-cut crystal element according to claim 2, wherein
the predetermined value Th is 0.05.

6. The AT-cut crystal element according to claim 2, wherein
the predetermined value Th is 0.033.

7. The AT-cut crystal element according to claim 1, wherein
both the side surfaces are each constituted of the three surfaces, which are the first surface, the second surface and the third surface.

8. The AT-cut crystal element according to claim 1, wherein
both the side surfaces are mutually disposed in a point symmetry with a center point of the crystal element as a center.

9. A crystal resonator, comprising:
the AT-cut crystal element according to claim 1;
excitation electrodes, disposed on a front surface and a back surface of the AT-cut crystal element; and
extraction electrodes, extracted from the excitation electrodes.

10. A crystal unit, comprising:
the crystal resonator according to claim 9; and
a container that houses the crystal resonator.

* * * * *